(12) United States Patent
Oshima

(10) Patent No.: US 8,456,335 B2
(45) Date of Patent: Jun. 4, 2013

(54) ANALOG-TO-DIGITAL CONVERTER

(75) Inventor: Takashi Oshima, Moriya (JP)

(73) Assignee: Hitachi, Ltd., Tokyo (JP)

( * ) Notice: Subject to any disclaimer, the term of this patent is extended or adjusted under 35 U.S.C. 154(b) by 54 days.

(21) Appl. No.: 13/297,505

(22) Filed: Nov. 16, 2011

(65) Prior Publication Data

US 2012/0133534 A1 May 31, 2012

(30) Foreign Application Priority Data

Nov. 26, 2010 (JP) ................................. 2010-263076

(51) Int. Cl.
*H03M 1/10* (2006.01)

(52) U.S. Cl.
USPC ............ 341/118; 341/122; 341/163; 341/172

(58) Field of Classification Search
None
See application file for complete search history.

(56) References Cited

U.S. PATENT DOCUMENTS

| | | | | | |
|---|---|---|---|---|---|
| 4,878,151 | A | * | 10/1989 | Gallichio | 361/329 |
| 4,918,454 | A | * | 4/1990 | Early et al. | 341/172 |
| 4,975,700 | A | * | 12/1990 | Tan et al. | 341/118 |
| 5,465,092 | A | * | 11/1995 | Mayes et al. | 341/118 |
| 6,404,376 | B1 | | 6/2002 | Kalthoff et al. | |
| 8,368,577 | B2 | * | 2/2013 | Aruga et al. | 341/172 |
| 2002/0149508 | A1 | * | 10/2002 | Hamashita | 341/172 |
| 2011/0234433 | A1 | * | 9/2011 | Aruga et al. | 341/110 |

FOREIGN PATENT DOCUMENTS

| | | |
|---|---|---|
| JP | 2003-504912 A | 2/2003 |
| JP | 2006-314035 A | 11/2006 |
| JP | 2008-118473 A | 5/2008 |

OTHER PUBLICATIONS

Hester, R. et al., Fully Differential ADC with Rail-to-Rail Common-Mode Range and Nonlinear Capacitor Compensation, IEEE Journal of Solid-State Circuits, vol. 25, No. 1, Feb. 1990 pp. 173-183.*
Wenbo Liu et al., "An Equalization-Based Adaptive Digital Background Calibration Technique for Successive Approximation Analog-to-Digital Converters", Electrical and Computer Engineering, University of Illinois, 2007, pp. 289-292, IEEE.
Wenbo Liu et al., "A 12b 22.5/45MS/s 3.0mW 0.059mm$^2$ CMOS SAR ADC Achieving Over 90dB SFDR", International Solid-State Circuits Conference, 2010, pp. 380-382, IEEE.

* cited by examiner

*Primary Examiner* — Howard Williams
(74) *Attorney, Agent, or Firm* — Crowell & Moring LLP

(57) ABSTRACT

In a successive approximation ADC, resolution is limited because a distortion occurs in an A/D conversion result due to a voltage dependence of a sampling capacitance. An A/D converter includes a sampling capacitor part in which capacitors equal in capacitance value to each other are connected inversely, a successive approximation A/D conversion part that conducts A/D conversion on the sampling charge, a digital correction part that corrects capacitance variation of internal DAC capacitors in the successive approximation A/D conversion part, and a digital correction part that digitally corrects a third-order or more factor of a voltage dependence of the sampling charge.

13 Claims, 19 Drawing Sheets

ANALOG-TO-DIGITAL CONVERTER

CLAIM OF PRIORITY

The present application claims priority from Japanese patent application JP 2010-263076 filed on Nov. 26, 2010, the content of which is hereby incorporated by reference into this application.

FIELD OF THE INVENTION

The present invention relates to an analog-to-digital converter that conducts digital correction.

BACKGROUND OF THE INVENTION

In next-generation high-definition medical diagnostic imaging devices, there is required an analog-to-digital converter that can realize an extremely high effective resolution of 18 bits or more at a conversion rate of 1 MS/s or higher. As such an ultrahigh resolution ADC, a sigma-delta ADC and a successive approximation ADC have been known.

In the case of the sigma-delta ADC, with employment of an internal quantizer of 1 bit, there is no need to provide a precision in an analog circuit. Also, with an increase in an internal operation clock frequency, a high effective resolution of 20 bits or more can be realized. However, in order to realize this high resolution, an over-sample rate of about 1000 times (internal operation clock frequency/conversion rate) is required. In the sigma-delta ADC, because an operational amplifier needs to operate at the internal operation clock frequency, an upper limit of the internal operation clock frequency becomes about 100 MHz due to a limit of its response speed. For that reason, in the sigma-delta ADC of 18 bits or more, the conversion rate remains at 100 kS/s or lower.

On the other hand, in the case of the successive approximation ADC, from the viewpoints that no over-sample operation is conducted unlike the sigma-delta ADC, and that no operational amplifier is required for an analog circuit part, there is a potential that the conversion rate higher than that of the sigma-delta ADC can be realized with the same effective resolution. However, in fact, the effective resolution depends on the rate precision of a capacitance value of each capacitive element configuring a DAC (hereinafter referred to as "internal DAC") included inside the successive approximation ADC. In a related-art successive approximation ADC, in order to enhance a precision of the internal DAC, an element size of each capacitive element within the internal DAC, that is, the capacitance value is increased to reduce a rate precision variation among the respective capacitance values, thereby obtaining a necessary resolution. Because the conversion rate of the successive approximation ADC is reduced in inverse proportion to the capacitance value, in this method, the limit of the effective resolution is 16 bits at the conversion rate of about 1 MS/s.

For that reason, in order to obtain the effective resolution of 18 bits or more at the conversion rate of 1 MS/s or more, there is required a technology for improving the conversion rate and the effective resolution without increasing the element size of each capacitive element. This technology is disclosed in the following related-art documents.

W. Liu and Y. Chiu, "An equalization-based adaptive digital background calibration technique for successive approximation analog-to-digital converters," International Conference on ASIC, pp. 289-292, October 2007, and W. Liu, P. Huang and Y. Chiu, "A 12b 22.5/45 MS/s 3.0 mW 0.059 mm2 CMOS SAR ADC achieving over 90 dB SFDR," IEEE International Solid-State Circuits Conference Digest of technical papers, pp. 380-381, February 2010 discloses a digital correction successive approximation ADC in which the rate precision variation of the capacitance value in the internal DAC is compensated in a digital region so as to employ a small-sized capacitive element and a small capacitance value with the result that the effective resolution up to about 12 bits can be realized while increasing the conversion rate.

Also, Japanese Unexamined Patent Publication No. 2006-314035 discloses a technology by which, in a charge redistribution successive approximation ADC, sampling capacitive elements are connected in antiparallel to each other as a capacitive element pair to cancel a voltage first-order dependence of the capacitance value, and prevent the deterioration of the rate precision of the capacity as much as possible. JP-T-2003-504912 discloses a technology in which, in the capacitive elements within a general ADC, the capacitive elements are likewise connected in antiparallel to each other.

SUMMARY OF THE INVENTION

However, the present inventors have found that the technologies disclosed in the above-mentioned related-art documents are inadequate to perform both of the conversion rate of 1 MS/s or more and the effective resolution of 18 bits or more in the successive approximation ADC.

First, in the successive approximation ADC having a high resolution, the effective resolution of 18 bits or more cannot be obtained in only the technology for subjecting the variation of the internal DAC to digital correction as disclosed in W. Liu and Y. Chiu, "An equalization-based adaptive digital background calibration technique for successive approximation analog-to-digital converters," and W. Liu, P. Huang and Y. Chiu, "A 12b 22.5/45 MS/s 3.0 mW 0.059 mm2 CMOS SAR ADC achieving over 90 dB SFDR". This is because of the following reason. In the successive approximation ADC, an input signal voltage is charged in a sampling capacitive element during sampling, and in this situation, the capacitance value of the capacitive element changes depending on the input signal voltage. As a result, a distortion occurs in the A/D conversion result to deteriorate the effective resolution. In order to realize the high resolution of 18 bits or more, there is a need to solve a problem on the distortion attributable to the voltage dependence.

In order to solve the above problem, even if the capacitive element pair disclosed in Japanese Unexamined Patent Publication No. 2006-314035 is applied to the technology disclosed in W. Liu and Y. Chiu, "An equalization-based adaptive digital background calibration technique for successive approximation analog-to-digital converters", a voltage second-order dependence of the capacitance value still remains although the voltage first-order dependence of the capacitance value is removed. If the sampling capacitance value thus has the voltage second-order dependence, sampled charge contains a third-order distortion component of the input voltage, which will be described later with the use of Expressions (1) to (4)). As a result of study, even if an MIM (metal insulator metal) capacitor small in the voltage dependence is used, it has been found there is a difficulty in realizing the resolution of 17 bits or more due to the generation of the above third-order distortion component of the sampling charge (the simulation result used in the above study will be described with reference to FIGS. 15 to 17). Also, if a MOS capacitor mountable in a small area due to the MIM capacitor is used, because the voltage dependence is larger than that of the MIM capacitor, an available resolution is further deteriorated.

As a technology for correcting the third-order distortion of the ADC, Japanese Unexamined Patent Publication No. 2008-118473 has been known in the case of a pipeline ADC. It should be noted that the technology disclosed in Japanese Unexamined Patent Publication No. 2008-118473 is different from the present invention in a structure of the ADC and an object to be corrected in the third-order distortion. The pipeline ADC that is an ADC of Japanese Unexamined Patent Publication No. 2008-118473 has a structure in which MDACs that are unit analog blocks are connected in series, and the object to be corrected in Japanese Unexamined Patent Publication No. 2008-118473 is the third-order distortion associated with the nonlinearity of operational amplifiers within the MDACs. In Japanese Unexamined Patent Publication No. 2008-118473, in order to correct the third-order distortion of the operational amplifier within each MDAC, an output of an MDAC that is been currently corrected is acquired as a digital value by likening the MDACs connected in series subsequent to that MDAC to ADCs with coarse precision. In this correction method, nevertheless, the attainable resolution is limited due to a limit of an output acquisition precision of the MDAC. Also, this correction method cannot be applied to the successive approximation ADC different in the configuration, and cannot also correct the third-order distortion of the sampling charge. Accordingly, the technology disclosed in Japanese Unexamined Patent Publication No. 2008-118473 does not contribute to a solution for the above problem.

In view of the above, an object of the present invention is to provide a successive approximation ADC that can perform both of a high conversion rate and a high resolution.

According to one aspect of the present invention, there is provided an A/D converter including: an input signal changeover switch that selects a received signal or a correction signal from an external; a sampling capacitor part that includes first and second capacitors each having a terminal connected in inverse parallel to each other, and having a capacitance value equal to each other, is electrically connected to the input signal changeover switch, and accumulates sampling charge sampling the received signal or the correction signal therein; a successive approximation A/D conversion part that includes a plurality of internal DAC capacitors, is electrically connected to the input signal changeover switch, and conducts A/D conversion on the sampling charge; a first digital correction part that is electrically connected to the successive approximation A/D conversion part, and digitally corrects respective capacitance variations of the plurality of internal DAC capacitors; and a second digital correction part that is electrically connected to the first digital correction part, and digitally corrects a third-order or more factor of a voltage dependence of the sampling charge.

Also, according to another aspect of the present invention, there is provided an A/D converter including: an input signal changeover switch that selects a received signal or a correction signal from an external; a successive approximation A/D conversion part that includes a plurality of capacitor parts that accumulate sampling charge sampling the received signal or the correction signal therein, is electrically connected to the input signal changeover switch, and conducts A/D conversion on the sampling charge; a first digital correction part that is electrically connected to the successive approximation A/D conversion part, and digitally corrects respective capacitance variations of the plurality of capacitor parts; and a second digital correction part that is electrically connected to the first digital correction part, and digitally corrects a third-order or more factor of a voltage dependence of the sampling charge, in which each of the plurality of capacitor parts includes first and second capacitors each having a terminal connected in inverse parallel to each other, and having a capacitance value equal to each other.

According to the aspects of the present invention, there can be provided the successive approximation ADC that can perform both of the high conversion rate and the high resolution.

DETAILED DESCRIPTION OF THE PREFERRED EMBODIMENTS

First Embodiment

Figure 1:
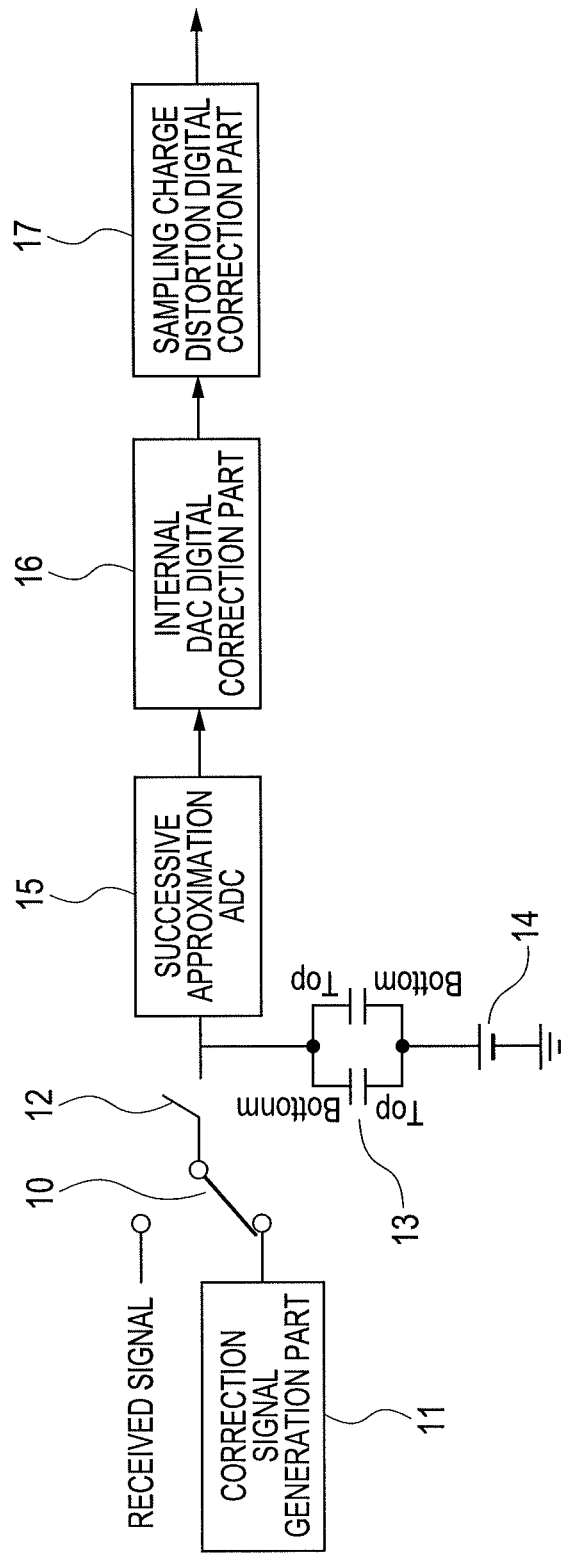
FIG. 1 is a diagram illustrating one configuration of a first embodiment of the present invention.

FIG. 1 illustrates a first embodiment of the present invention. An A/D converter in FIG. 1 includes an input signal changeover switch 10, a sampling part having a sampling switch 12, a sampling capacitor 13, and a bias voltage source 14, a successive approximation A/D conversion part 15, an internal DAC digital correction part 16 connected to a downstream of the successive approximation A/D conversion part 15, a sampling charge distortion digital correction part 17 connected to a downstream of the internal DAC digital correction part 16, and a correction signal generation part 11 that generates a correction signal.

Figure 2:
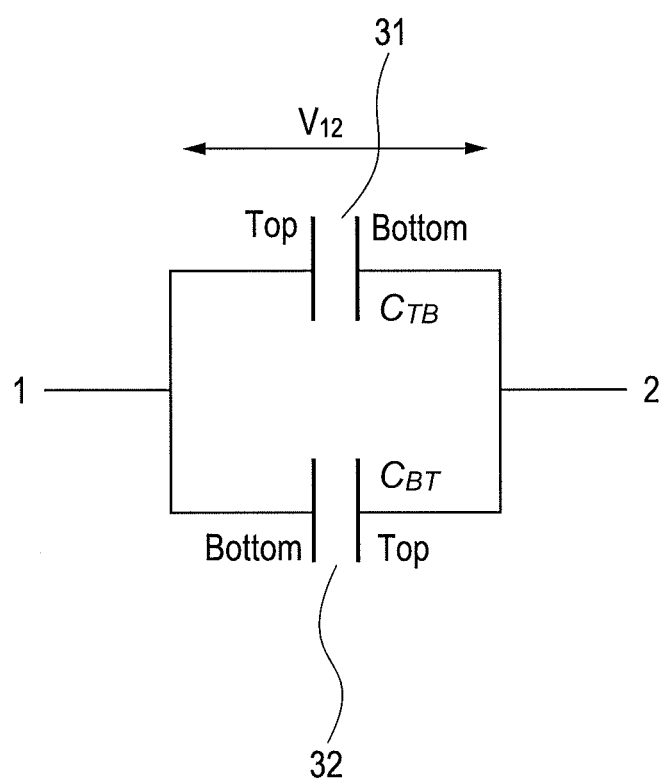
FIG. 2 is a diagram illustrating another configuration of the first embodiment of the present invention.

The successive approximation ADC conducts A/D conversion on charge sampled by the sampling capacitor 13. The sampling capacitor 13 is of a structure in which a first capacitor and a second capacitor each having the same capacitance value are connected in inverse parallel to each other. With this structure, a first-order dependence of the capacitance value on an input signal voltage is offset whereby a second-order distortion of sampling charge is suppressed so that third-order or more distortion can become dominant. That is, as illustrated in FIG. 2, when it is assumed that a voltage applied between both ends of the capacitive elements connected in inverse parallel to each other is V12 (defined as a voltage of a node 1 relative to a node 2), a capacitance value $C_{TB}$ of an upper capacitive element 31, a capacitance value $C_{BT}$ of a lower capacitive element 32, and a parallel capacitance value CTB+CBT are represented by Expressions (1) to (3), respectively. It is found from Expression (3) that the voltage first-order dependence (and subsequent odd-order components) of the capacitance value is removed by parallel connection.

$$C_{TB} = C(1 + a_2 \cdot V_{12} + a_2 \cdot V_{12}^2 + \ldots) \quad (1)$$

$$C_{BT} = C(1 - a_2 \cdot V_{12} + a_2 \cdot V_{12}^2 + \ldots) \quad (2)$$

$$C_{TB} + C_{BT} = 2C(1 + a_2 \cdot V_{12}^2 + \ldots) \quad (3)$$

Referring to FIG. 1, an input signal voltage Vin is applied to both ends of the sampling capacitor 13 connected in parallel. That is, 0V12=Vin is met. For that reason, in a sampling charge Q accumulated in the sampling capacitor 13, as represented by Expression (4), an odd-order distortion component is suppressed, and a third-order distortion component of the input signal voltage Vin becomes dominant. Subsequently, terms of a fifth-order distortion, a seventh-order distortion, . . . remain.

$$\begin{aligned} Q &= (C_{TB} + C_{BT}) \cdot V_{in} \\ &= 2C(1 + a_2 \cdot V_{in}^2 + \ldots) \cdot V_{in} \\ &= 2C \cdot V_{in} + 2C \cdot a_2 \cdot V_{in}^3 + \ldots \end{aligned} \quad (4)$$

Based on the above, a procedure of correcting the ADC in FIG. 1 will be described. First, the capacitance value variation of the respective capacitive elements included in the internal DAC is subjected to digital correction. In order to achieve the digital correction, the correction signal generation part generates an internal DAC correction signal, and an output of the correction signal generation part is selected by the input signal changeover switch 10. When the sampling switch 12 turns on, the internal DAC correction signal voltage is charged in the sampling capacitor 13 to obtain the sampling charge. The sampling charge is subjected to A/D conversion in a charge region by the successive approximation A/D conversion part 15, and a multi-bit digital output of the successive approximation A/D conversion part 15 is input to the internal DAC digital correction part 16. The internal DAC digital correction part 16 corrects the capacitance value variation of the respective capacitive elements included in the internal DAC of the successive approximation A/D conversion part 15 through digital operation. In order to achieve the digital correction, an internal DAC correction factor is calculated from the multi-bit digital input, and an inner product of the obtained internal DAC correction factor and the multi-bit digital input is computed to conduct the digital correction of the internal DAC.

With the above digital correction, an influence of the capacitance value variation of the respective capacitive elements within the successive approximation A/D conversion part 15 can be suppressed. For that reason, in an output signal of the internal DAC digital correction part 16, the third-order or more distortion of the sampling charge described in Expression (4) becomes main noise. Accordingly, after the digital correction of the internal DAC has been completed, the third-order or more, distortion of the sampling charge is digitally corrected. If the even-order factors (fifth order, seventh order, . . . ) in the factors higher than the third order are similarly corrected, the precision is further improved.

For that reason, the correction signal generation part generates the sampling charge distortion correction signal, and an output of the sampling charge distortion correction signal is selected by the input signal changeover switch 10. When the sampling switch 12 turns on, the sampling charge distortion correction signal voltage is charged in the sampling capacitor 13 to obtain the sampling charge. The sampling charge is subjected to A/D conversion by the successive approximation A/D conversion part 15, and the multi-bit digital output of the successive approximation A/D conversion part 15 is input to the internal DAC digital correction part 16. The internal DAC digital correction part 16 computes and outputs the inner product of the multi-bit digital signal with the use of the internal DAC correction factor obtained at the time of the above digital correction of the internal DAC. As a result, the A/D conversion result of the sampling charge with high precision is obtained as the output of the internal DAC digital correction part 16. The output of the internal DAC digital correction part 16 is input to the sampling charge distortion digital correction part 17. The sampling charge distortion digital correction part 17 calculates the sampling charge distortion correction factor upon inputting the output of the internal DAC digital correction part 16, and subtracts the sampling charge distortion component included in the output of the internal DAC digital correction part 16 on the basis of the obtained sampling charge distortion correction factor to suppress the sampling charge distortion.

After the digital correction of the sampling charge distortion has been completed, an operation mode is changed to a normal A/D conversion operation mode. That is, the received signal is selected by the input signal changeover switch 10, the sampling switch 12 turns on, and the received signal voltage is charged in the sampling capacitor 13 to obtain the sampling charge. The sampling charge is subjected to A/D conversion by the successive approximation A/D conversion part 15, and the multi-bit digital output of the successive approximation A/D conversion part 15 is subjected to the digital correction by the internal DAC digital correction part 16 with the use of the internal DAC correction factor obtained at the time of the above digital correction of the inner DAC. Further, the output of the internal DAC digital correction part 16 is input to the sampling charge distortion digital correction part 17, and subjected to the digital correction with the use of the sampling charge distortion correction factor obtained at the time of the above digital correction of the sampling charge distortion.

Figure 15:
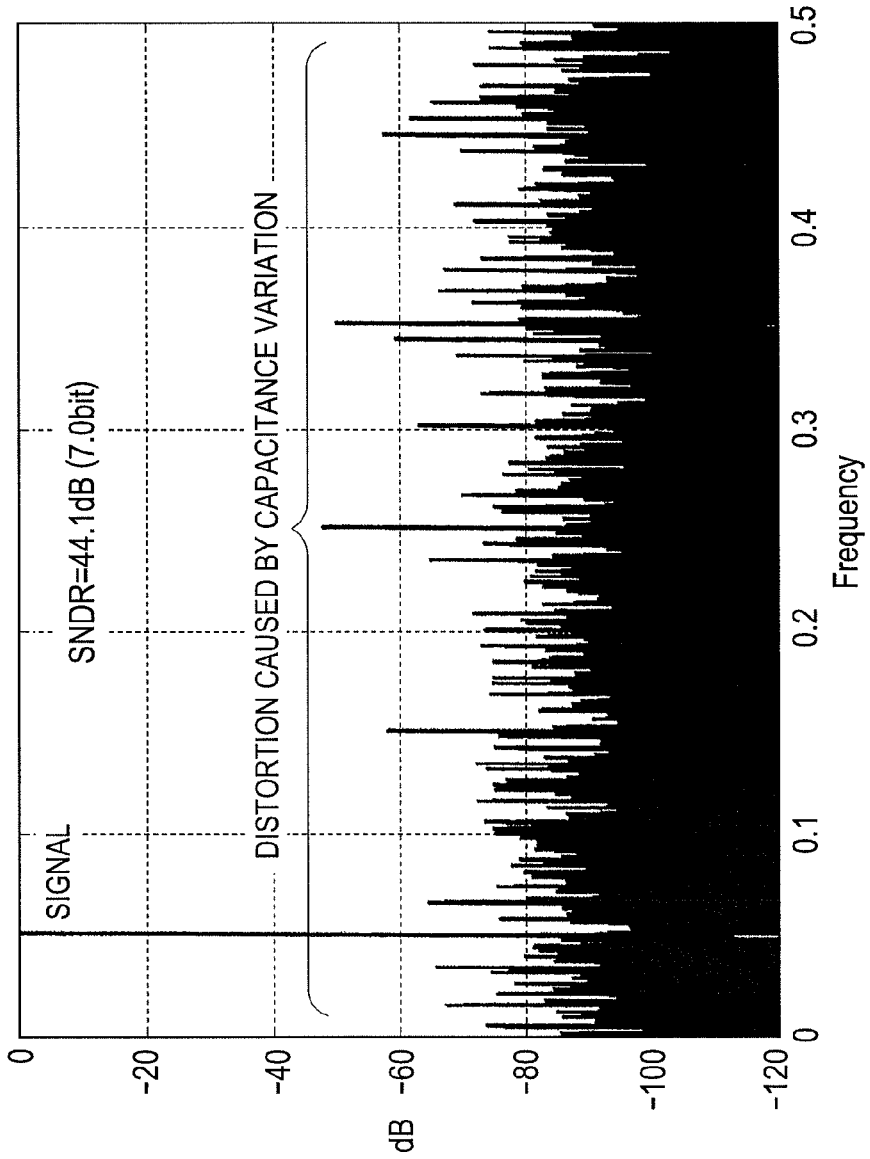
FIG. 15 is a diagram illustrating one simulation result in a related art.
Figure 16:
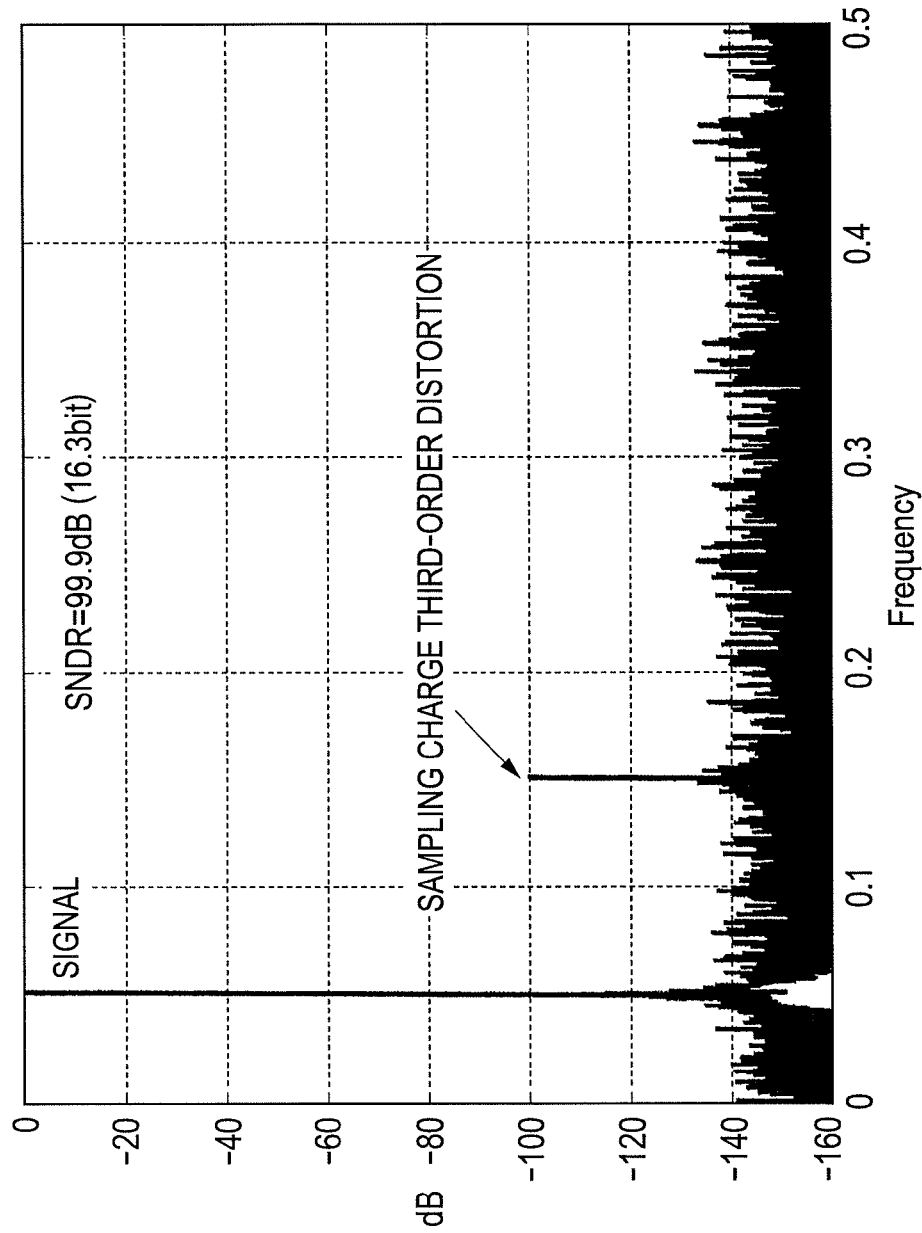
FIG. 16 is a diagram illustrating another simulation result in a related art.
Figure 17:
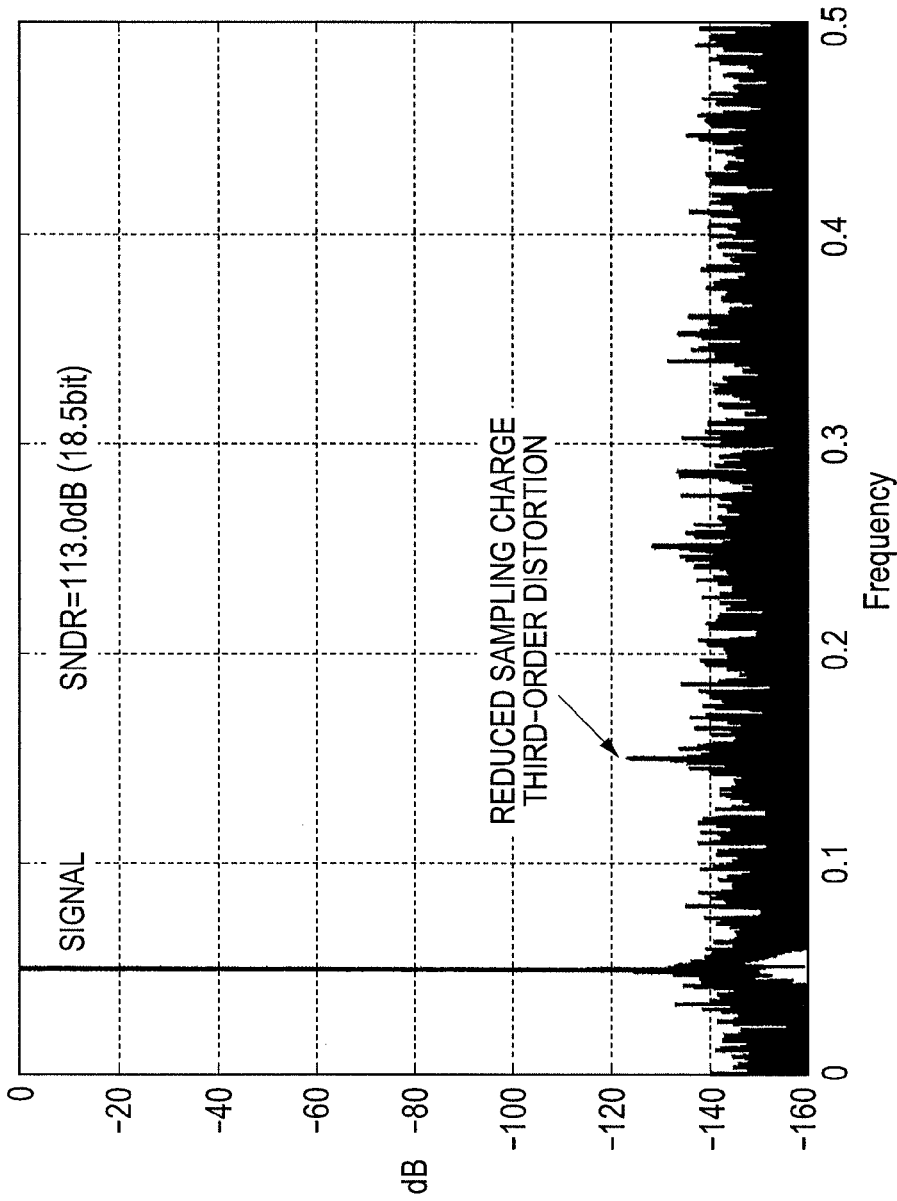
FIG. 17 is a diagram illustrating a simulation result according to the present invention.

FIG. 15 illustrates a spectrum in the simulation result of the A/D conversion when none of the digital correction of the internal DAC and the digital correction of the sampling charge distortion is conducted in the charge redistribution successive approximation ADC having a quantized error level of 20 bits. In this example, it is assumed that the variation of the internal DAC capacitance value is ±2%, and $a_2$=48 ppm is met. SNDR (Signal to Noise and Distortion Ratio)=44.1 dB, and the effective resolution=7.0 bit are obtained from the above spectrum. FIG. 16 illustrates a spectrum in the simulation result of the A/D conversion when only the digital correction of the internal DAC is conducted, and the digital correction of the sampling charge distortion is not conducted under the same condition. SNDR=99.9 dB and the effective resolution=16.3 bit are met. In FIG. 16, a spurious tone corresponding to the sampling charge third-order distortion is observed, and the spurious tone becomes a factor that deteriorates the effective resolution. On the other hand, as illustrated in FIG. 17, when both of the digital correction of the internal DAC and the digital correction of the sampling charge distortion are conducted, the sampling charge third-order distortion is suppressed as represented by a spectrum of FIG. 17, and SNDR=113.0 dB and the effective resolution=18.5 bit are obtained. From this fact, it is conceivable that the present invention is effective in realizing the high resolution of 18 bits or more.

Figure 3:
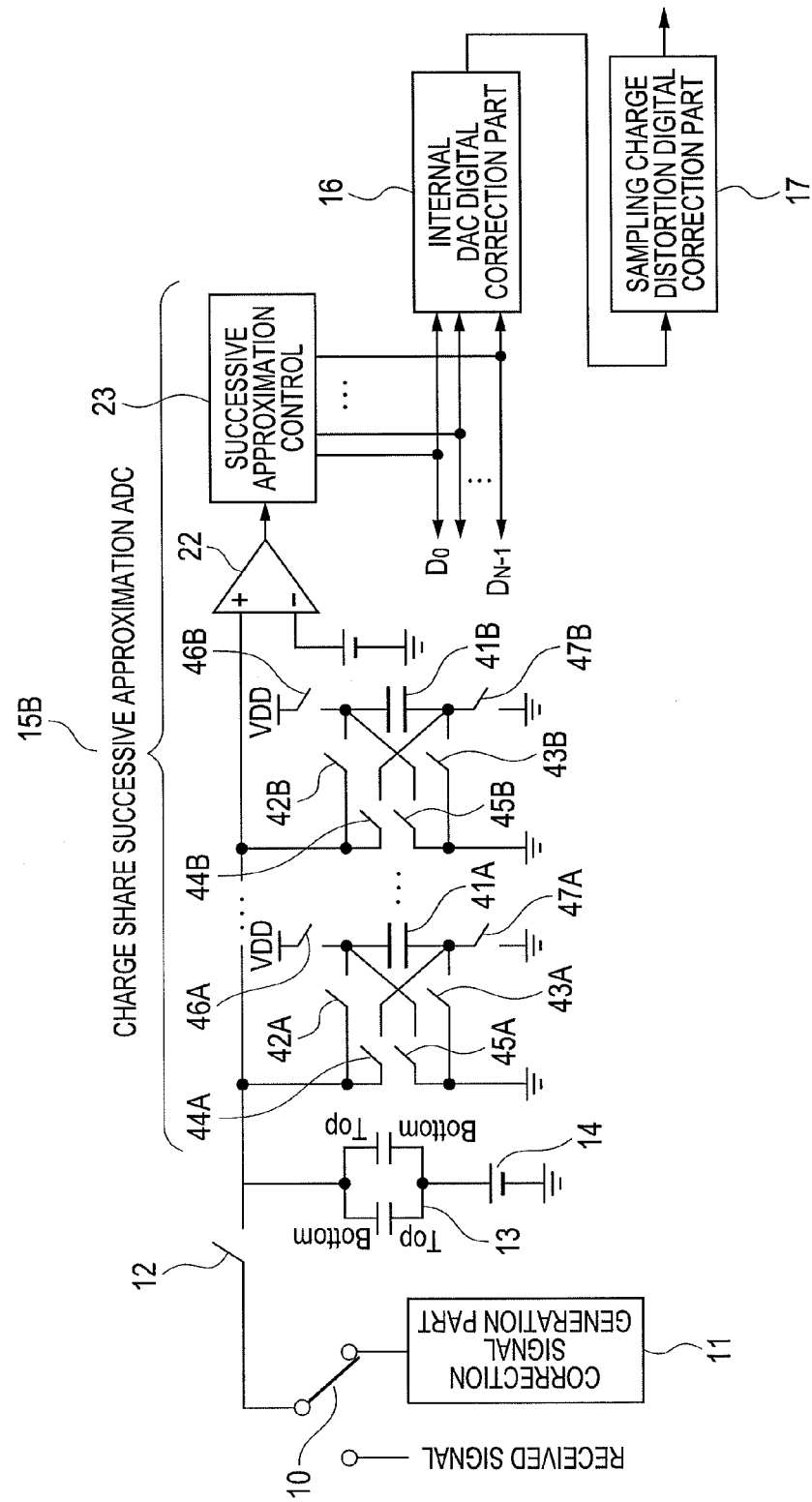
FIG. 3 is a diagram illustrating still another configuration of the first embodiment of the present invention.

FIG. 3 illustrates an A/D converter in which the successive approximation A/D conversion part 15 is particularly configured by a charge sharing successive approximation ADC 15B. In the charge sharing successive approximation ADC, the sampling capacitor 13 and internal DAC capacitances 41A and 41B are provided separately.

The A/D converter in FIG. 3 includes the charge sharing successive approximation ADC 15B which is totally configured by the input signal changeover switch 10, the sampling part having the sampling switch 12, the sampling capacitor 13, and the bias voltage source 14, a comparator 22, a successive approximation control part 23, the internal DAC capacitors 41A and 41B, respective forward connection switches 42A, 42B and 43A, 43B, respective backward connection switches 44A, 44B and 45A, 45B, respective power side precharge switches 46A, 46B, and respective ground side precharge switches 47A, 47B. The A/D converter of FIG. 3 also includes the internal DAC digital correction part 16 connected to a downstream of the charge sharing successive approximation ADC 15B, the sampling charge distortion digital correction part 17 connected to a downstream of the internal DAC digital correction part 16, and the correction signal generation part 11 that generates the correction signal. The respective internal DAC capacitances 41A and 41B function as the internal DAC capacitor with application of capacitance values weighted with binary or nonbinary to the internal DAC capacitor 41A for a bit subsequent to an MSB (most significant bit) and the internal DAC capacitor 41B for an LSB (least significant bit). The sampling capacitor 13 is mounted so that the capacitors having the same capacitance value are connected in inverse parallel to each other.

First, the charge sharing successive approximation ADC 15B is subjected to the digital correction. In order to achieve the digital correction, the correction signal generation part 11 generates the internal DAC correction signal, and an output of the correction signal generation part 11 is selected by the input signal changeover switch 10. When the sampling switch 12 turns on, the internal DAC correction signal voltage is charged in the sampling capacitor 13 to obtain the sampling charge. The sampling charge is subjected to the A/D conversion in the charge region by the charge sharing successive approximation ADC 153 in a normal method.

More specifically, when the power side precharge switches 46A and 46B and the ground side precharge switches 47A and 47B for the respective bits first turn on, the internal DAC capacitors 41A and 41B for the respective bits are connected to VDD that is a high reference voltage, and a ground that is a low reference voltage, an a voltage of the VDD is applied to the internal DAC capacitors 41A and 41B. In this situation, the capacitance values change due to the voltage dependence of the respective internal DAC capacitors 41A and 41B. During this precharging, a voltage applied between the terminals of those capacitors is always VDD not depending on the input signal voltage. Therefore, the charge for precharge which is accumulated in those capacitors is always held constant for each conversion not depending on the input signal voltage. Accordingly, since the voltage dependence of the capacitance value results in the precharge charge variation (that is, capacitance value variation), the digital correction can be conducted by the internal DAC digital correction part 16 that will be described later.

After completion of the precharge, the power side precharge switches 46A, 46B, and the ground side precharge switches 47A, 47B turn off. Then, the sampling charge is subjected to A/D conversion in the order of the MSB to the lower bit. First, for determination of the MSB, the comparator 22 determines whether the sampling voltage is positive or negative. As a result, if the sampling voltage is positive, the comparator 22 outputs an H voltage, and if the sampling voltage is negative, the comparator 22 outputs an L voltage. This is the conversion result of the MSB. Then, if the output of the comparator 22 is H, the successive approximation control part 23 turns on the backward connection switches 44A and 45A for the bit subsequent to the MSB to subtract the charge precharged in the internal DAC capacitor 41A for subsequent bit determination of the MSB from the sampling charge. The subtracted result is generated in a positive input terminal node of the comparator 22 as the voltage. On the other hand, if the output of the comparator 22 is L, the successive approximation control part 23 turns on the forward connection switches 42A and 43A for the bit subsequent to the MSB to add the charge precharged in the internal DAC capacitor 41A for subsequent bit determination of the MSB to the sampling charge. The added result is generated in the positive input terminal node of the comparator 22 as the voltage. The comparator 22 determines whether the generated voltage is positive or negative, and a binary output of the comparator 22 becomes a conversion result of the bit subsequent to the MSB. Likewise, in the subsequent operation, the conversion of the lower bit is sequentially conducted down to the LSB, thereby obtaining the A/D conversion output of the charge sharing successive approximation ADC 15B.

The multi-bit digital output of the charge sharing successive approximation ADC 15B, which has been thus obtained, is input to the internal DAC digital correction part 16. The internal DAC digital correction part 16 corrects the precharge charge variation of the respective internal DAC capacitors 41A and 41B configuring the internal DAC of the charge sharing successive approximation ADC 15B through digital operation. In order to achieve the correction, the internal DAC correction factor is calculated according to the multi-bit digital input, and an inner product of the internal DAC correction factor thus obtained and the multi-bit digital input is computed to conduct the digital correction of the internal DAC.

After the digital correction of the internal DAC has been completed, the digital correction of the sampling charge distortion is conducted. In order to achieve the digital correction, the correction signal generation part 11 generates the sampling charge distortion correction signal, and an output of the correction signal generation part 11 is selected by the input signal changeover switch 10. As in the above description, the sampling charge distortion correction signal voltage is charged in the sampling capacitor 13 to obtain the sampling charge. As in the above description, the sampling charge is subjected to A/D conversion by the charge sharing successive approximation ADC 15B, and the multi-bit digital output of the charge sharing successive approximation ADC 15B is input to the internal DAC digital correction part 16. The internal DAC digital correction part 16 computes the inner product of the multi-bit digital input with the use of the internal DAC correction factor obtained at the time of the above digital correction of the internal DAC, and outputs the inner product. As a result, the A/D conversion result of the sampling charge with high precision is obtained as the output of the internal DAC digital correction part 16. The output of the internal DAC digital correction part 16 is input to the sampling charge distortion digital correction part 17. The sampling charge distortion digital correction part 17 calculates the sampling charge distortion correction factor upon inputting the output of the internal DAC digital correction part 16, and subtracts the sampling charge distortion component included in the output of the internal DAC digital correction part 16 on the basis of the obtained sampling charge distortion correction factor to suppress the sampling charge distortion.

After the digital correction of the sampling charge distortion has been completed, the operation mode is changed to the normal A/D conversion operation mode. That is, the received signal is selected by the input signal changeover switch 10. As in the above description, the received signal voltage is charged in the sampling capacitor 13 to obtain the sampling charge. The sampling charge is subjected to A/D conversion by the charge sharing successive approximation A/D conversion part 15B, and the multi-bit digital output of the charge sharing successive approximation A/D conversion part 15B is subjected to the digital correction by the internal DAC digital correction part 16 with the use of the internal DAC correction factor obtained at the time of the above digital correction of the inner DAC. Further, the output of the internal DAC digital correction part 16 is input to the sampling charge distortion digital correction part 17, and subjected to the digital correction with the use of the sampling charge distortion correction factor obtained at the time of the above digital correction of the sampling charge distortion.

Based on the above, the A/D converter according to this embodiment includes the input signal changeover switch 10 that selects the received signal or the correction signal from the external; the sampling capacitor part 13 that includes the first capacitor Ctb and the second capacitor Ctb each having a terminal connected in inverse parallel to each other, and having a capacitance value equal to each other, is electrically connected to the input signal changeover switch, and accumulates the sampling charge sampling the received signal or the correction signal therein; the successive approximation A/D conversion part 15 that includes the plurality of internal DAC capacitors 41A and 41B, is electrically connected to the input signal changeover switch, and conducts A/D conversion on the sampling charge; the first digital correction part 16 that is electrically connected to the successive approximation A/D conversion part, and digitally corrects the respective capacitance variations of the plurality of internal DAC capacitors; and the second digital correction part 17 that is electrically connected to the first digital correction part, and digitally corrects the third-order or more factor of a voltage dependence of the sampling charge. With the above operation, the precharge charge variation (that is, capacitance variation) within the internal DAC can be corrected by the internal DAC digital correction part 16, and the sampling charge distortion (voltage dependence of sampling charge) can be corrected by the configuration of the sampling capacitor part and the second digital correction part. As a result, the A/D conversion result with high precision in which both of the precharge charge variation of the internal DAC and the sampling charge distortion are corrected can be obtained from the received signal. This embodiment illustrates a single end circuit configuration, but a differential circuit configuration can be likewise applied to the present invention.

Second Embodiment

Figure 4:
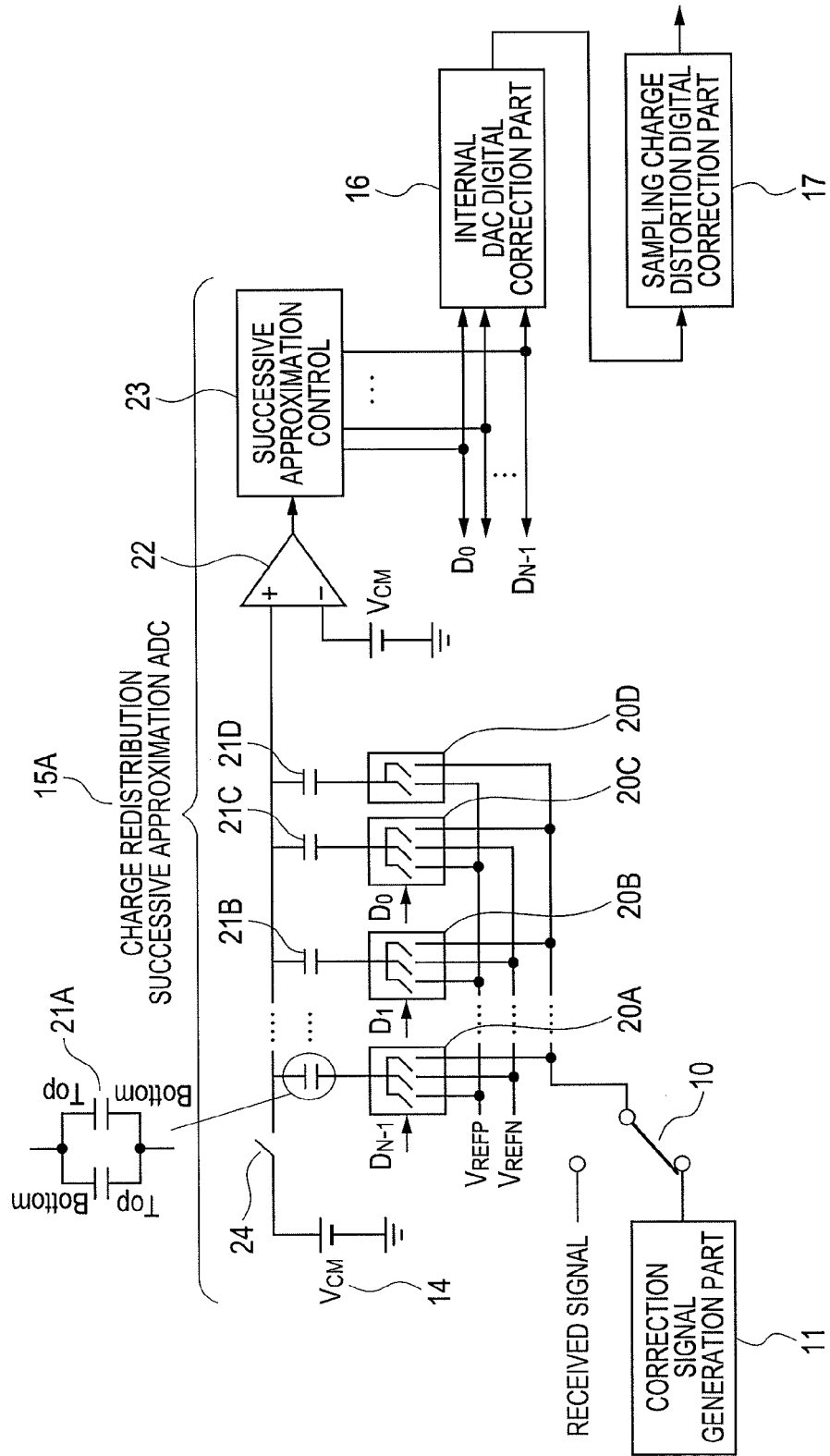
FIG. 4 is a diagram illustrating a configuration of a second embodiment of the present invention.

FIG. 4 illustrates a second embodiment of the present invention. In this embodiment, referring to FIG. 1, the successive approximation A/D conversion part 15 is configured by a charge redistribution successive approximation ADC 15A. In the charge redistribution successive approximation ADC, internal DAC capacitors 21A to 21D also function as the sampling capacitor.

An A/D converter in FIG. 4 includes the charge redistribution successive approximation ADC 15A which is totally configured by the input signal changeover switch 10, the sampling part having sampling/DAC changeover switches 20A to 20D, internal DAC/sampling capacitors 21A to 21D, the bias voltage source 14, and a reset switch 24, the comparator 22, and the successive approximation control part 23. The A/D converter of FIG. 4 also includes the internal DAC digital correction part 16 connected to a downstream of the charge redistribution successive approximation ADC 15A, the sampling charge distortion digital correction part 17 connected to a downstream of the internal DAC digital correction part 16, and the correction signal generation part 11 that generates the correction signal. The respective internal DAC/sampling capacitors 21A to 21C function as the internal DAC capacitor with application of capacitance values weighted with binary or nonbinary to the MSB 21A to the LSB 21C. Also, the internal DAC/sampling capacitor 21D has the same capacitance value as that of the internal DAC/sampling capacitor 21C of the LSB. The respective internal DAC/sampling capacitors 21A to 21D are mounted so that the capacitors having the same capacitance value are connected in inverse parallel to each other. The respective internal DAC/sampling capacitors 21A to 21C are connected to the input signal voltage Vin, a high reference voltage $V_{REFP}$, or a low reference voltage $V_{REFN}$ by the sampling/DAC changeover switches 20A to 20C, respectively. Also, the internal DAC/sampling capacitor 21D is connected to the input signal voltage Vin or the high reference voltage $V_{REFP}$ by the sampling/DAC changeover switch 20D.

First, the internal DAC of the charge redistribution successive approximation ADC 15A is subjected to the digital correction. In order to achieve the digital correction, the correction signal generation part 11 generates the internal DAC correction signal, and an output of the correction signal generation part 11 is selected by the input signal changeover switch 10. The sampling/DAC changeover switches 20A to 20D connects the respective internal DAC/sampling capacitors 21A to 21D to an input signal side, that is, the internal DAC correction signal voltage generated by the correction signal generation part 11. Also, when the reset switch 24 also turns on, when the sampling switch 12 turns on, the internal DAC correction signal voltage is charged in the internal DAC/sampling capacitors 21A to 21D to obtain the sampling charge. The sampling charge is subjected to the A/D conversion in the charge region by the charge redistribution successive approximation ADC 15A in a normal method. More specifically, for determination of the MSB, first, the internal DAC/sampling capacitor 21A of the MSB is connected to $V_{REFP}$, and the other internal DAC/sampling capacitors 21B to 21D are connected to $V_{REFN}$. With this configuration, charge transfer is conducted, and the charge corresponding to a difference between the sampling charge and the MSB determination reference charge is generated in the positive input terminal of the comparator 22 as the voltage. With this configuration, the comparator 22 outputs a low (L) voltage when (sampling charge)—(MSB determination reference charge) is positive, and a high (H) voltage when (sampling charge)—(MSB determination reference charge) is negative. When the output of the comparator 22 is L, the successive approximation control part 23 connects the sampling/DAC changeover switch 20B for the bit subsequent to the MSB to $V_{REFP}$, and the other sampling/DAC changeover switches 20A, 20C, and 20D are held in a connection state at the time of the MSB determination as they are. On the other hand, when the output of the comparator 22 is H, the successive approximation control part 23 connects the sampling/DAC changeover switch 20A for the MSB to $V_{REFN}$, connects the sampling/DAC changeover switch 20B for the bit subsequent to the MSB to $V_{REFP}$, and the other respective sampling/DAC changeover switches 20C and 20D are held in a connection state as they are. Hereinafter, as in the same manner as that of the determination of the MSB, the determination of the bits subsequent to the next bit of the MSB is conducted, and in this situation, the successive approximation control part 23 appropriately controls the respective sampling/DAC changeover switches 20A to 20D in order to set the reference charge for the subsequent bit determination on the basis of the binary output of the comparator 22. With the above operation, the multi-bit digital outputs of the charge redistribution successive approximation ADC 15A, which are obtained for the MSB to the LSB, are input to the internal DAC digital correction part 16. The capacitance value variation of the respective internal DAC/sampling capacitors 21A to 21D configuring the internal DAC of the charge redistribution successive approximation ADC 15A is corrected through the digital operation. In order to achieve the correction, the internal DAC correction factor is calculated according to the multi-bit digital input, and the inner product of the obtained internal DAC correction factor and the multi-bit digital input is computed to digitally correct the internal DAC.

After the digital correction of the internal DAC has been completed, the digital correction of the sampling charge distortion is conducted. In order to achieve this digital connection, the correction signal generation part 11 generates the sampling charge distortion correction signal, and an output of the correction signal generation part 11 is selected by the input signal changeover switch 10. As in the above description, the sampling charge distortion correction signal voltage is charged in the respective internal DAC/sampling capacitors 21A to 21D to obtain the sampling charge. As in the above description, the sampling charge is subjected to A/D conversion by the charge redistribution successive approximation ADC 15A, and the multi-bit digital output of the charge redistribution successive approximation ADC 15A is input to the internal DAC digital correction part 16. The internal DAC digital correction part 16 computes the inner product of the multi-bit digital input with the use of the internal DAC correction factor obtained at the time of the above digital correction of the internal DAC, and outputs the inner product. As a result, the A/D conversion result of the sampling charge with high precision is obtained as the output of the internal DAC digital correction part 16. The output of the internal DAC digital correction part 16 is input to the sampling charge distortion digital correction part 17. The sampling charge distortion digital correction part 17 calculates the sampling charge distortion correction factor upon inputting the output of the internal DAC digital correction part 16, and subtracts the sampling charge distortion component included in the output of the internal DAC digital correction part 16 on the basis of the obtained sampling charge distortion correction factor to suppress the sampling charge distortion.

After the digital correction of the sampling charge distortion has been completed, the operation mode is changed to the normal A/D conversion operation mode. That is, the received signal is selected by the input signal changeover switch 10. As in the above description, the received signal voltage is charged in the respective internal DAC/sampling capacitors 21A to 21D to obtain the sampling charge. The sampling charge is subjected to A/D conversion by the charge redistribution successive approximation ADC 15A, and the multi-bit digital output of the charge redistribution successive approximation ADC 15A is subjected to the digital correction by the internal DAC digital correction part 16 with the use of the internal DAC correction factor obtained at the time of the above digital correction of the inner DAC. Further, the output of the internal DAC digital correction part 16 is input to the sampling charge distortion digital correction part 17, and subjected to the digital correction with the use of the sampling charge distortion correction factor obtained at the time of the above digital correction of the sampling charge distortion. As a result, the A/D conversion result with high precision in which both of the capacitance value variation of the internal DAC and the sampling charge distortion are corrected can be obtained from the received signal.

In the case of the charge redistribution successive approximation ADC, the conversion precision is affected when the sampling charge and the conversion step determination reference charge become close to each other in the respective conversion steps from the MSB to the LSB. In this case, because the positive input terminal voltage of the comparator 22 becomes substantially equal to a bias voltage 14 ($V_{CM}$), a voltage to be applied between both terminals of the respective internal DAC/sampling capacitors 21A to 21D is a fixed value independent from the input signal voltage. That is, the other ends of the respective internal DAC/sampling capacitors 21A to 21D are connected to any one of $V_{REFP}$ and $V_{REFN}$, as a result of which the respective inter-terminal voltages become ($V_{REFP}-V_{CM}$) or ($V_{REFN}-V_{CM}$), and those voltages are values independent from the input signal voltage. For that reason, the voltage dependence of the capacitance value of the respective internal DAC/sampling capacitors 21A to 21D equivalently results in the capacitance value variation. As a result, at the time of the digital correction of the internal DAC, the influence of the voltage dependence of the capacitance value can be also corrected. On the other hand, at the time of sampling, the sampling charge accumulated in the respective internal DAC/sampling capacitors 21A to 21D has the third-order distortion due to the input signal voltage dependence of the capacitance values of the respective internal DAC/sampling capacitors 21A to 21D, as described above. Therefore, the correction is conducted by the sampling charge distortion digital correction part 17.

Based on the above, the A/D converter according to this embodiment includes: an input signal changeover switch that selects a received signal or a correction signal from an external; a successive approximation A/D conversion part that includes a plurality of capacitor parts that accumulate sampling charge sampling the received signal or the correction signal therein, is electrically connected to the input signal changeover switch, and conducts A/D conversion on the sampling charge; a first digital correction part that is electrically connected to the successive approximation A/D conversion part, and digitally corrects respective capacitance variations of the plurality of capacitor parts; and a second digital correction part that is electrically connected to the first digital correction part, and digitally corrects a third-order or more factor of a voltage dependence of the sampling charge, in which each of the plurality of capacitor parts includes first and second capacitors each having a terminal connected in inverse parallel to each other, and having a capacitance value equal to each other. With the above configuration, as in the A/D converter according to the first embodiment, the A/D conversion result with high precision in which both of the capacitance value variation of the internal DAC and the sampling charge distortion are corrected can be obtained from the received signal. This embodiment illustrates the single end circuit configuration, but the differential circuit configuration can be likewise applied to the present invention.

Third Embodiment

Figure 5:
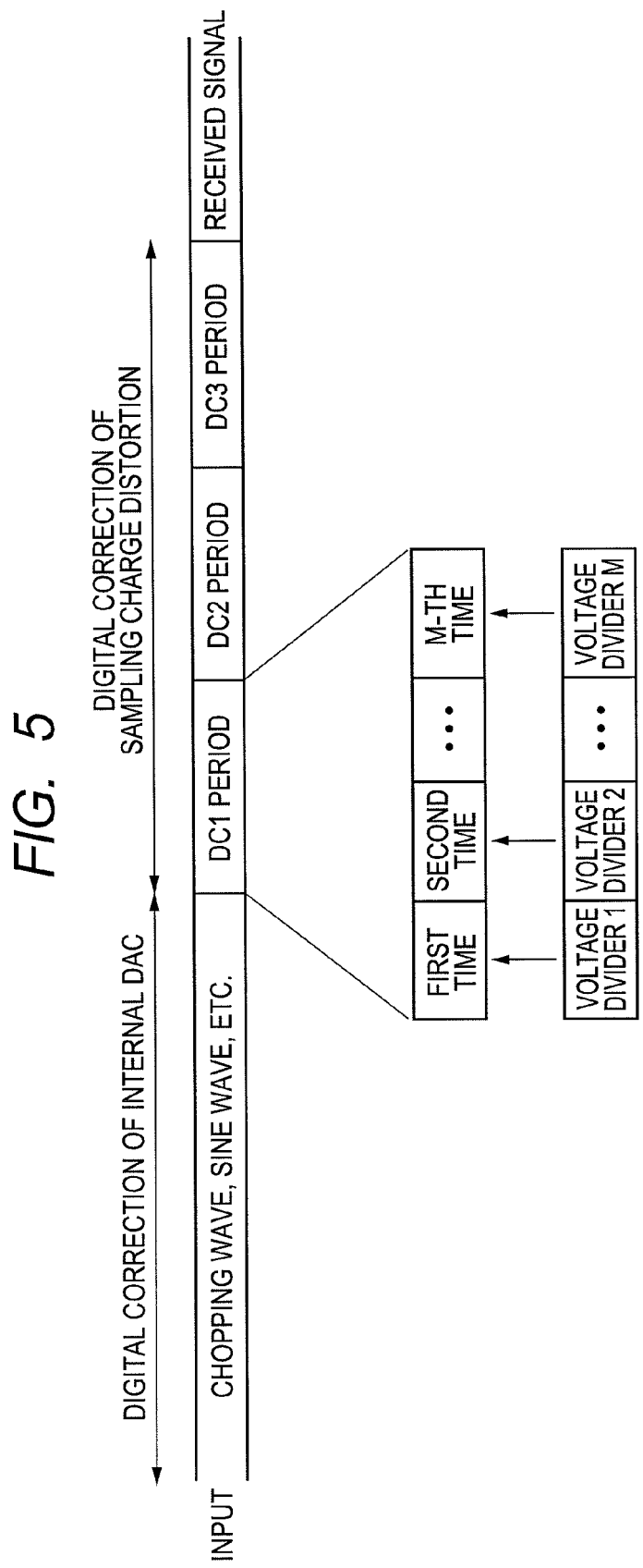
FIG. 5 is a diagram illustrating the operation of a third embodiment of the present invention.

As a third embodiment of the present invention, FIG. 5 illustrates an example of the operation timing. At the time of the digital correction of the internal DAC, the correction signal generation part 11 generates a waveform in which a value is widely changed within an input range of the ADC such as a chopping wave or a sine wave as the internal DAC correction signal, to thereby activate a lookup algorithm of the internal DAC correction factor in the internal DAC digital correction part 16 so that the convergence of the lookup algorithm can be enhanced. Also, at the time of the digital correction of the sampling charge distortion, the correction signal generation part 11 generates DC voltages DC1, DC2, and DC3 having three kinds of voltage values as the sampling charge distortion correction signals. With the use of those DC voltages DC1, DC2, and DC3, the sampling charge distortion digital correction part 17 conducts the digital correction. Specifically, if DC=0 is met, the DC voltages of two voltage values may be generated.

Hereinafter, a description will be given of a method of deviating the sampling charge distortion correction factor in the case of DC1=0V, DC2=$V_{REF}$/4, DC3=$3V_{REF}$/4 ($V_{REF}$=$V_{REFP}$−$V_{REFN}$). After the digital correction of the internal DAC has been completed, because the sampling charge can be subjected to the A/D conversion with high precision, an output $AD_{OUT}$(Vin) of the internal DAC digital correction part 16 with respect to the input signal voltage Vin is represented by Expression (5). In this expression, K is an uncertain factor of a constant factor remaining after the digital correction of the internal DAC has been completed, and ΔV is a residual offset. In general, K takes a value sufficiently close to 1, and ΔV takes a value sufficiently close to 0. The sampling charge appears as a term of $a_2 V_{in}^3$, and $a_2$ corresponds to the voltage second-order dependent factor of the sampling capacitor 13. From Expression (5), the outputs of the internal DAC digital correction part 16 at the time of inputting the DC voltages DC1, DC2, and DC3 are represented by Expressions (6) to (8), respectively.

$$AD_{OUT}(V_{in})=K(V_{in}+a_2 \cdot V_{in}^3)+\Delta V \quad (5)$$

$$AD_{OUT}(0)=\Delta V \quad (6)$$

$$AD_{OUT}(V_{REF}/4)=K(V_{REF}/4+a_2 \cdot (V_{REF}/4)^3)+\Delta V \quad (7)$$

$$AD_{OUT}(3V_{REF}/4)=K(3V_{REF}/4+a_2 \cdot (3V_{REF}/4)^3)+\Delta V \quad (8)$$

Elimination of ΔV with (7)−(6) and (8)−(6) obtains (9) and (10), respectively.

$$AD_{OUT}(V_{REF}/4)-AD_{OUT}(0)=K \cdot V_{REF}/4+K \cdot a_2 \cdot (V_{REF}/4)^3 \quad (9)$$

$$AD_{OUT}(3V_{REF}/4)-AD_{OUT}(0)=3K \cdot V_{REF}/4+K \cdot a_2 \cdot (3V_{REF}/4)^3 \quad (10)$$

From Expressions (9)*3 to (10), when a first term of a right side is eliminated, Expression (11) is obtained.

$$K \cdot a_2 = 8/3\{AD_{OUT}(3V_{REF}/4)-AD_{OUT}(0)-3(AD_{OUT}(V_{ref}/4)-AD_{OUT}(0))\} \quad (11)$$

Expression (11) represents that the sampling charge distortion correction factor $Ka_2$ can be calculated with the use of output values $AD_{OUT}(0)$, $AD_{OUT}(V_{REF}/4)$, and $AD_{OUT}(3V_{REF}/4)$ of the internal DAC digital correction part 16 at the time of inputting the DC voltages DC1, DC2, and DC3. In this way, in the A/D converter according to this embodiment, the correction signal generation part 11 generates at least two DC voltages (DC2=Vref/4, DC3=3Vref/4) different in the voltage value from each other, and the sampling charge distortion digital correction part 17 digitally corrects the third-order or more factor of the voltage dependence of the sampling charge with the aid of the outputs of the internal DAC digital correction part 16 corresponding to those DC voltages.

In the normal operation mode, a product of the cube of the output value $AD_{OUT}$(Vin) of the internal DAC digital correction part 16 obtained at the time of supplying the input signal Vin, and the sampling charge distortion correction factor $Ka_2$ previously calculated is subtracted from the output value $AD_{OUT}$(Vin), to thereby obtain an output $AD_{OUT\_Final}$(Vin) in which the sampling charge distortion is suppressed as represented by Expression (12). When an offset voltage is also corrected, the output $AD_{OUT}(0)$ of the internal DAC digital correction part 16 at the applying the DV voltage DC1=0V is equal to ΔV as represented by Expression (6). Therefore, the output $AD_{OUT}(0)$ may be subtracted as represented in Expression (12) to realize the correction of the offset voltage.

$$AD_{OUT\_Final}(V_{in})=AD_{OUT}(V_{in})-K \cdot a_2 \cdot AD_{OUT}(V_{in})^3 - AD_{OUT}(0) \quad (12)$$

Figure 10:
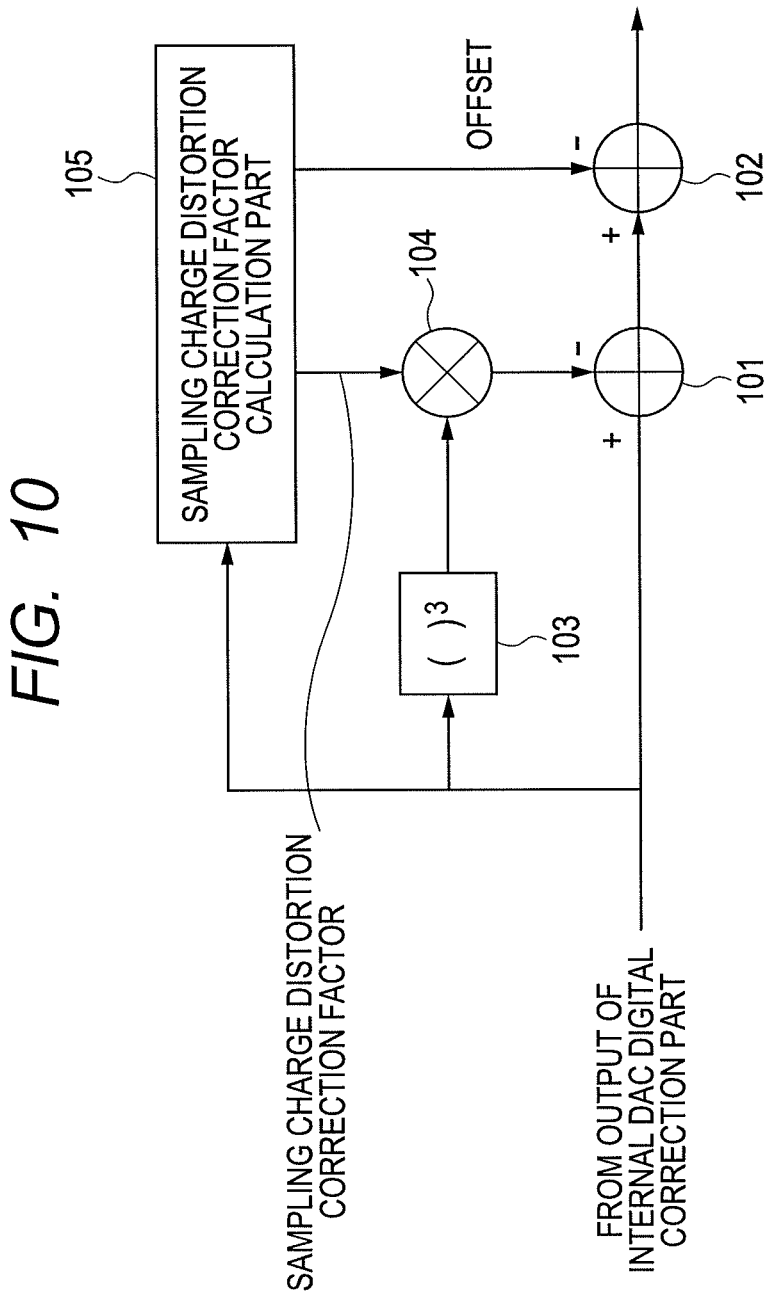
FIG. 10 is a diagram illustrating a configuration of a sampling charge distortion digital correction part.

The sampling charge distortion digital correction part 17 can be realized by, for example, a configuration of FIG. 10, and has a function of calculating the sampling charge distortion correction factor $Ka_2$ at the time of correcting the sampling charge distortion, with the use of the output values $AD_{OUT}(0)$, $AD_{OUT}(V_{REF}/4)$, and $AD_{OUT}(3V_{REF}/4)$ of the internal DAC digital correction part 16 at the time of inputting the DC voltages DC1, DC2, and DC3, through the computation of Expression (11). For that reason, the output of the upstream internal DAC digital correction part 16 is input to a sampling charge distortion correction factor calculation part 105 to calculate the sampling charge distortion correction factor through the computation of Expression (11). Also, an offset ΔV may be also calculated as the output $AD_{OUT}(0)$ of the internal DAC digital correction part 16 at the time of applying the DC voltage DC1=0V. In the normal operation mode, the input value to the sampling charge distortion digital correction part 17 is cubed by a cuber 103, and the cubed result is multiplied by the sampling charge distortion correction factor previously obtained, and subtracted from the input value by a subtractor 101. Further, as needed, the offset ΔV previously obtained may be subtracted by a subtractor 102 to also correct the offset.

In this embodiment, as illustrated in FIG. 5, the respective voltages DC1, DC2, and DC3 may be subjected to A/D conversion plural times (M times), and the sampling charge distortion correction factor may be calculated through Expression (11) with M average values of the outputs of the internal DAC digital correction part 16 as the outputs $AD_{OUT}(0)$, $AD_{OUT}(V_{REF}/4)$, and $AD_{OUT}(3V_{REF}4)$. As a result, noise occurring within the correction signal generation part 11 or the successive approximation A/D conversion part 15 can be reduced to 1/√M.

Further, as illustrated in FIG. 5, for example, the same voltage DC1 is generated by a voltage divider 1-M having an identical resistive configuration, and an output of a voltage divider M is sequentially selected and applied from a voltage divider 1 for each of the M times, thereby enabling the process variation of the DC1 voltage value to be reduced to 1/√M. The same is also applied to the voltages DC2 and DC3.

Figure 9:
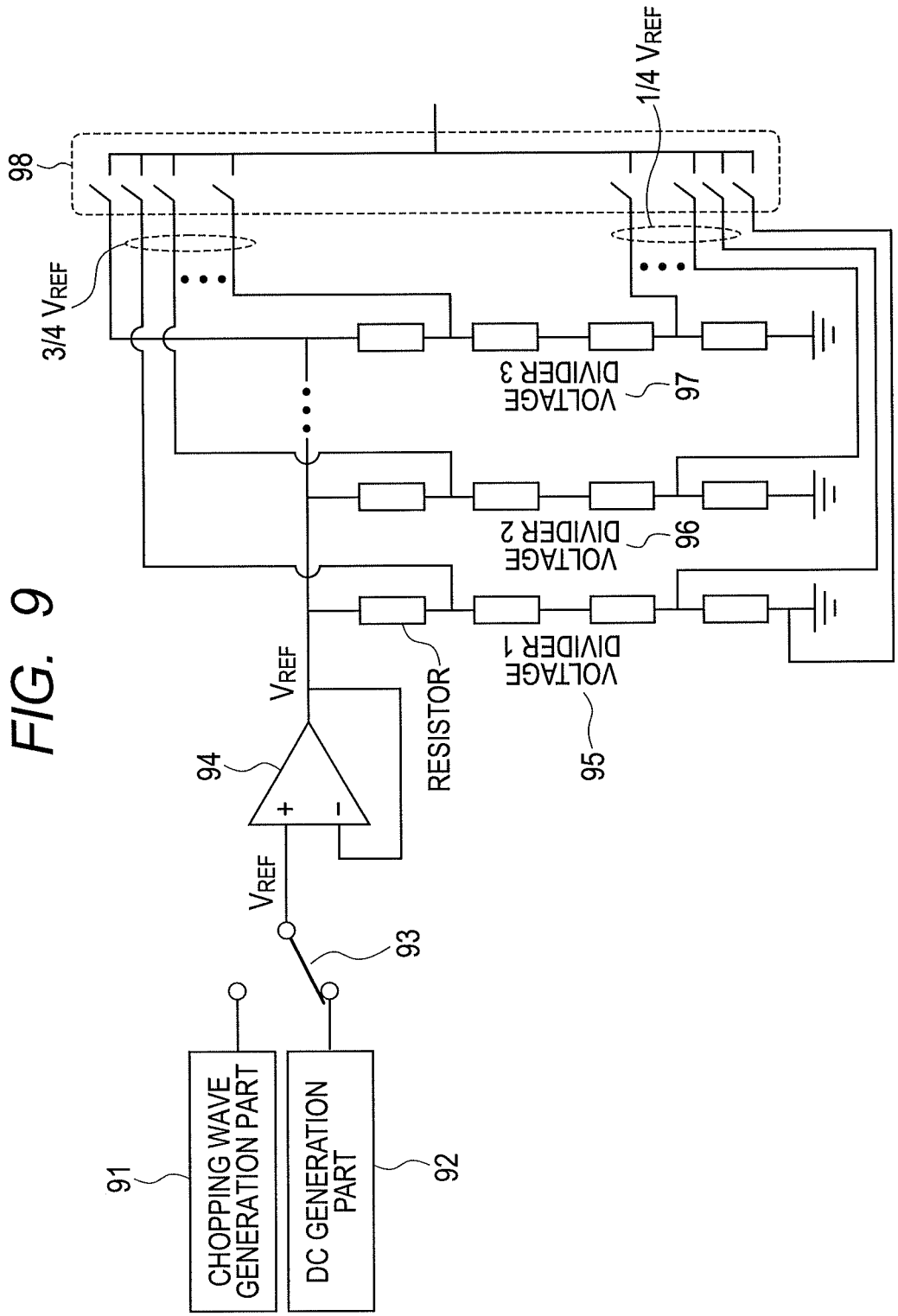
FIG. 9 is a diagram illustrating a configuration of a correction signal generation part.

FIG. 9 illustrates an example of the correction signal generation part 11 having the M voltage dividers. FIG. 9 illustrates the single end circuit, but the same is applied to a differential circuit. The correction signal generation part 11 includes a chopping wave generation part 91, a reference DC generation part 92, a correction signal changeover switch 93 that switches between the outputs of the reference DC generation part 92 and the correction signal changeover switch 93, a buffer 94, voltage dividers 1(95), 2(96), and 3(97) which are connected to an output of the buffer 94, and a multiplexer 98 that switches the outputs of the buffer 94 and the voltage dividers 1-M(95-97).

At the time of the digital correction of the internal DAC, a chopping wave output of the chopping wave generation part 91 is selected by the correction signal changeover switch 93, and output as the output of the correction signal generation part 11 through the buffer 94 configured by an operational amplifier. In order to achieve this output, only an uppermost switch in a multiplexer 98 turns on. In order to conduct the digital correction of the internal DAC described in a fourth embodiment, the chopping wave may be a stepped chopping waveform in which the output is held constant every two conversion periods of the ADC.

At the time of the digital correction of the sampling charge distortion, the reference voltage $V_{REF}$ generated by the reference DC generation part 92 is selected by the correction signal changeover switch 93, and transmitted to the voltage dividers 1-M(95-97) through the buffer 94. The voltage dividers 1-M(95-97) have the same circuit configuration, and realizes a resistance voltage divider circuit. FIG. 9 illustrates a case in which the voltage dividers 1-M(95-97) output DC1=0V, DC2=$V_{REF}$/4, and DC3=3$V_{REF}$/4. The DC voltage outputs of the respective voltage dividers are connected to the multiplexer 98, and appropriately selected as the output of the correction signal generation part 11.

In a method of calculating the sampling charge distortion correction factor represented by Expression (11), a relative precision is required for the voltage values DC1, DC2, DC3, but an absolute precision can be reduced to several %. Also, waveform precision is not required for the chopping wave used at the time of the digital correction of the internal DAC. For that reason, a gain of the operational amplifier configuring the buffer 94 may be a low gain of about 40 dB.

Fourth Embodiment

Figure 6:
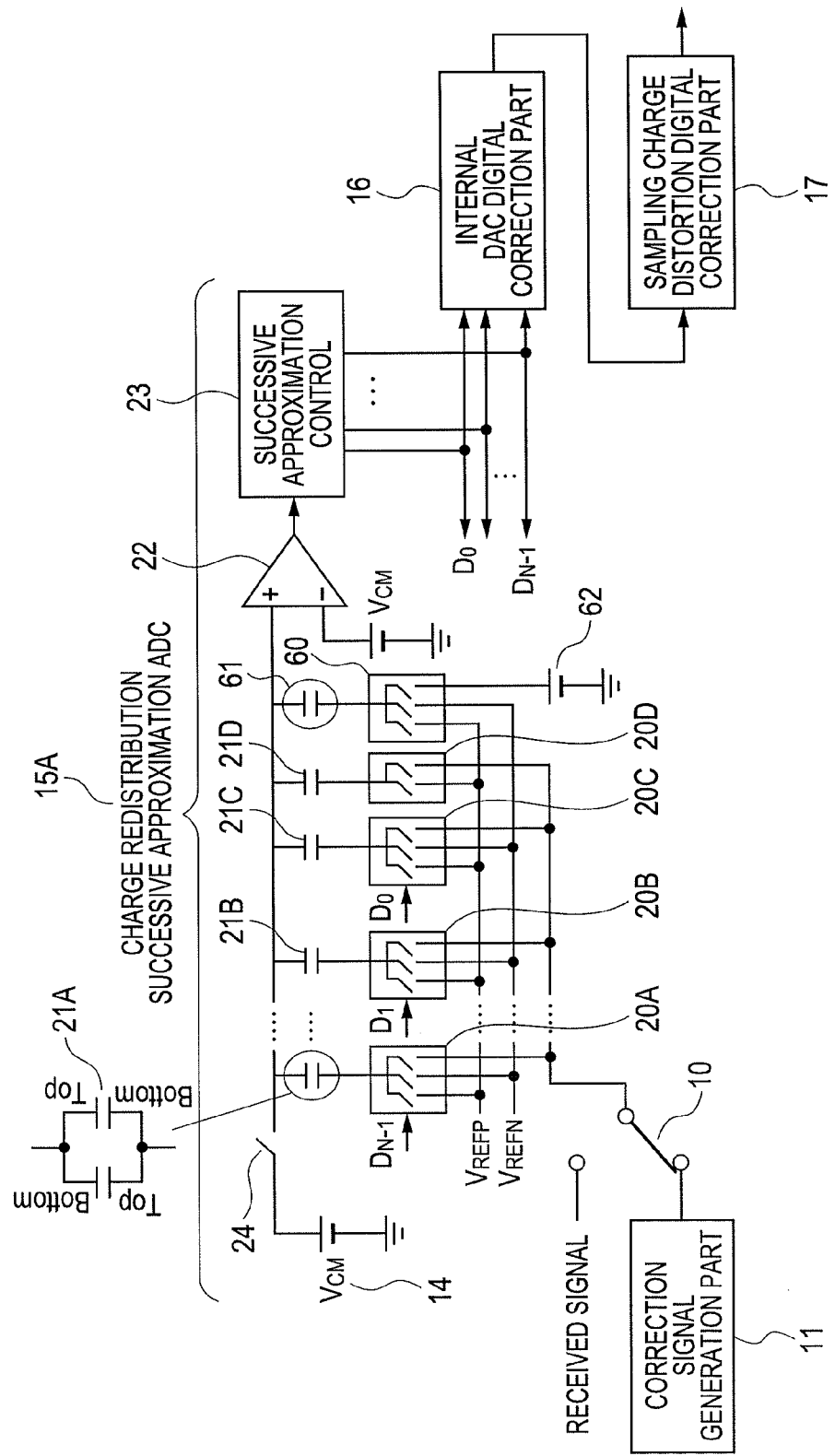
FIG. 6 is a diagram illustrating a configuration of a fourth embodiment of the present invention.

FIG. 6 illustrates a fourth embodiment of the present invention. An A/D converter of this embodiment includes the charge redistribution successive approximation ADC 15A which is totally configured by the input signal changeover switch 10, the sampling part having the sampling/DAC changeover switches 20A to 20D, the internal DAC/sampling capacitors 21A to 21D, the bias voltage source 14, and the reset switch 24, the comparator 22, and the successive approximation control part 23, illustrating an example of the digital correction of the internal DAC in the second embodiment in detail. The A/D converter also includes the internal DAC digital correction part 16 connected to a downstream of the charge redistribution successive approximation ADC 15A, the sampling charge distortion digital correction part 17 connected to a downstream of the internal DAC digital correction part 16, and the correction signal generation part 11 that generates the correction signal. The respective internal DAC/sampling capacitors 21A to 21C function as the internal DAC capacitor with application of capacitance values weighted with binary or nonbinary to the MSB 21A to the LSB 21C. Also, the internal DAC/sampling capacitor 21D has the same capacitance value as that of the internal DAC/sampling capacitor 21C of the LSB. The respective internal DAC/sampling capacitors 21A to 21C are connected to the input signal voltage Vin, the high reference voltage $V_{REFP}$, or the low reference voltage $V_{REFN}$ by the sampling/DAC changeover switches 20A to 20C, respectively. Also, the internal DAC/sampling capacitor 21D is connected to the input signal voltage Vin or the high reference voltage $V_{REFP}$ by the sampling/DAC changeover switch 20D.

In addition to the above configuration, the A/D converter in this embodiment includes a DC shift capacitor 61, a DC shift switch 60, and a midpoint voltage source 62. The midpoint voltage source 62 generates a DC voltage of ($V_{REFP}$+$V_{REFN}$)/2 which is an average voltage of the high reference voltage $V_{REFP}$ and the low reference voltage $V_{REFN}$.

In this example, the respective internal DAC/sampling capacitors 21A to 21D and the DC shift capacitor 61 are mounted so that the capacitors having the same capacitance value are connected in inverse parallel to each other. Also, a voltage VCM of the bias voltage source 14 may be selected to be equal to the voltage ($V_{REFP}$+$V_{REFN}$)/2 of the midpoint voltage source 62.

First, the digital correction of the internal DAC in the charge redistribution successive approximation ADC 15A is conducted. For example, the digital correction of the internal DAC is conducted by "split digital correction" disclosed in W. Liu, P. Huang and Y. Chiu, "A 12b 22.5/45 MS/s 3.0 mW 0.059 mm2 CMOS SAR ADC achieving over 90 dB SFDR,". The split digital correction is a method in which the correction factor is searched in the digital correction part so that the ADC subjects the same input voltage to the A/D conversion twice while applying DC shifts different from each other, and two conversion outputs match each other except for the DC shift amount. In order to search the correction factor, the correction signal generation part allows a signal used for the plural A/D conversions in the ADC to be included in the correction signal. It is conceivable that the signal of this type is, for example, a stepped waveform in which the voltage is held constant every plural periods of the A/D conversion. The ADC repeats a pair of the A/D conversions with the use of the correction signal. In this situation, even if a distortion occurs in the sampling charge, the same distortion amount is held in the two A/D conversions, resulting in no influence of the distortion on the search precision of the correction factor of the split digital correction.

The correction signal generation part 11 generates a stepped waveform in which the output is held constant every two conversion periods of the charge redistribution successive approximation ADC 15A as the internal DAC correction signal so that the same input voltage can be subjected to A/D conversion twice. The output the correction signal generation part 11 is selected by the input signal changeover switch 10. The sampling/DAC changeover switches 20A to 20D connect the respective internal DAC/sampling capacitors 21A to 21D to the input signal side, that is, the internal DAC correction signal voltage generated by the correction signal generation part 11. Also, the reset switch 24 also turns on, and the internal DAC correction signal voltage is charged in the respective internal DAC/sampling capacitors 21A to 21D to obtain the sampling charge. In this situation, the DC shift switch 60 is connected to the midpoint voltage source 62 side to reset the charge in the DC shift capacitor 61.

The sampling charge is subjected to the A/D conversion in the charge region by the charge redistribution successive approximation ADC 15A in a normal method. In the paired A/D conversions, the A/D conversion is conducted in a state the DC shift different between a first A/D conversion and a second A/D conversion.

More specifically, in the first A/D conversion, in order to apply a negative DC shift, the DC shift switch 60 is connected to $V_{REFP}$. On the other hand, in the second A/D conversion, in order to apply a positive DC shift, the DC shift switch 60 is connected to $V_{REFN}$. This connection starts at the same time as a start of the following MSB deterioration, and continues until the LSB determination is completed.

The respective conversion steps from the MSB to the LSB are identical with those in the second embodiment. That is, for determination of the MSB, first, the internal DAC/sampling capacitor 21A of the MSB is connected to $V_{REFP}$, and the other internal DAC/sampling capacitors 21B to 21D are connected to $V_{REFN}$. With this configuration, charge transfer is conducted, and the charge corresponding to a difference between the sampling charge and the MSB determination reference charge is generated in the positive input terminal of the comparator 22 as the voltage. With this configuration, the comparator 22 outputs a low (L) voltage when (sampling charge)—(MSB determination reference charge) is positive, and a high (H) voltage when (sampling charge)—(MSB determination reference charge) is negative. When the output of the comparator 22 is L, the successive approximation control part 23 connects the sampling/DAC changeover switch 20B for the bit subsequent to the MSB to $V_{REFP}$, and the other sampling/DAC changeover switches 20A, 20C, and 20D are held in a connection state at the time of the MSB determination as they are. On the other hand, when the output of the comparator 22 is H, the successive approximation control part 23 connects the sampling/DAC changeover switch 20A for the MSB to $V_{REFN}$, connects the sampling/DAC changeover switch 20B for the bit subsequent to the MSB to $V_{REFP}$, and the other respective sampling/DAC changeover switches 20C and 20D are held in a connection state as they are. Hereinafter, in the same manner as that of the determination of the MSB, the determination of the bits subsequent to the next bit of the MSB is conducted, and in this situation, the successive approximation control part 23 appropriately controls the respective sampling/DAC changeover switches 20A to 20D in order to set the reference charge for the subsequent bit determination on the basis of the binary output of the comparator 22.

With the above operation, the multi-bit digital outputs of the charge redistribution successive approximation ADC 15A, which are obtained for the MSB to the LSB, are input to the internal DAC digital correction part 16. The internal DAC digital correction part 16 processes two A/D conversions of the multi-bit digital input as one pair, and searches the internal DAC correction factor so that both of the A/D conversions are positioned except for the DC shift amount. The inner product of the obtained internal DAC correction factor and the multi-bit digital input is computed to conduct the digital correction of the internal DAC.

After the digital correction of the internal DAC has been completed, the digital correction of the sampling charge distortion is conducted as in the second embodiment. In order to achieve this digital correction, the correction signal generation part 11 generates the sampling charge distortion correction signal, and an output of the correction signal generation part 11 is selected by the input signal changeover switch 10. As in the above description, the sampling charge distortion correction signal voltage is charged in the respective internal DAC/sampling capacitors 21A to 21D to obtain the sampling charge. In this situation, the DC shift switch 60 is connected to the midpoint voltage source 62 side. The sampling charge is subjected to the A/D conversion by the charge redistribution successive approximation ADC 15A as in the above description, and the multi-bit digital output is input to the internal DAC digital correction part 16. In this situation, because no DC shift application is required, the DC shift switch 60 remains connected to the midpoint voltage source 62 as it is.

The internal DAC digital correction part 16 computes and outputs the inner product of the multi-bit digital input with the use of the internal DAC correction factor obtained at the time of the previous digital correction of the internal DAC. As a result, the A/D conversion result of the sampling charge with high precision is obtained from the output of the internal DAC digital correction part 16. The output of the internal DAC digital correction part 16 is input to the sampling charge distortion digital correction part 17. The sampling charge distortion digital correction part 17 calculates the sampling charge distortion correction factor from the input thereof, and subtracts the sampling charge distortion component included in the output of the internal DAC digital correction part 16 on the basis of the obtained sampling charge distortion correction factor to suppress the sampling charge distortion.

After the digital correction of the sampling charge distortion has been completed, the operation mode is changed to the normal A/D conversion operation mode. That is, the received signal is selected by the input signal changeover switch 10. As in the above description, the received signal voltage is charged in the respective internal DAC/sampling capacitors 21A to 21D to obtain the sampling charge. In this situation, the DC shift switch 60 is connected to the midpoint voltage source 62 side. The sampling charge is subjected to A/D conversion by the charge redistribution successive approximation ADC 15A. In this situation, because no DC shift application is required, the DC shift switch 60 remains connected to the midpoint voltage source 62 as it is. The multi-bit digital output of the charge redistribution successive approximation ADC 15A is subjected to the digital correction by the internal DAC digital correction part 16 with the use of the internal DAC correction factor obtained at the time of the above digital correction of the inner DAC. Further, the output of the internal DAC digital correction part 16 is input to the sampling charge distortion digital correction part 17, and subjected to the digital correction with the use of the sampling charge distortion correction factor obtained at the time of the above digital correction of the sampling charge distortion. As a result, the A/D conversion result with high precision in which both of the capacitance value variation of the internal DAC and the sampling charge distortion are corrected can be obtained from the received signal.

This embodiment illustrates the single end circuit configuration, but the differential circuit configuration can be likewise applied to the present invention.

Fifth Embodiment

Figure 7:
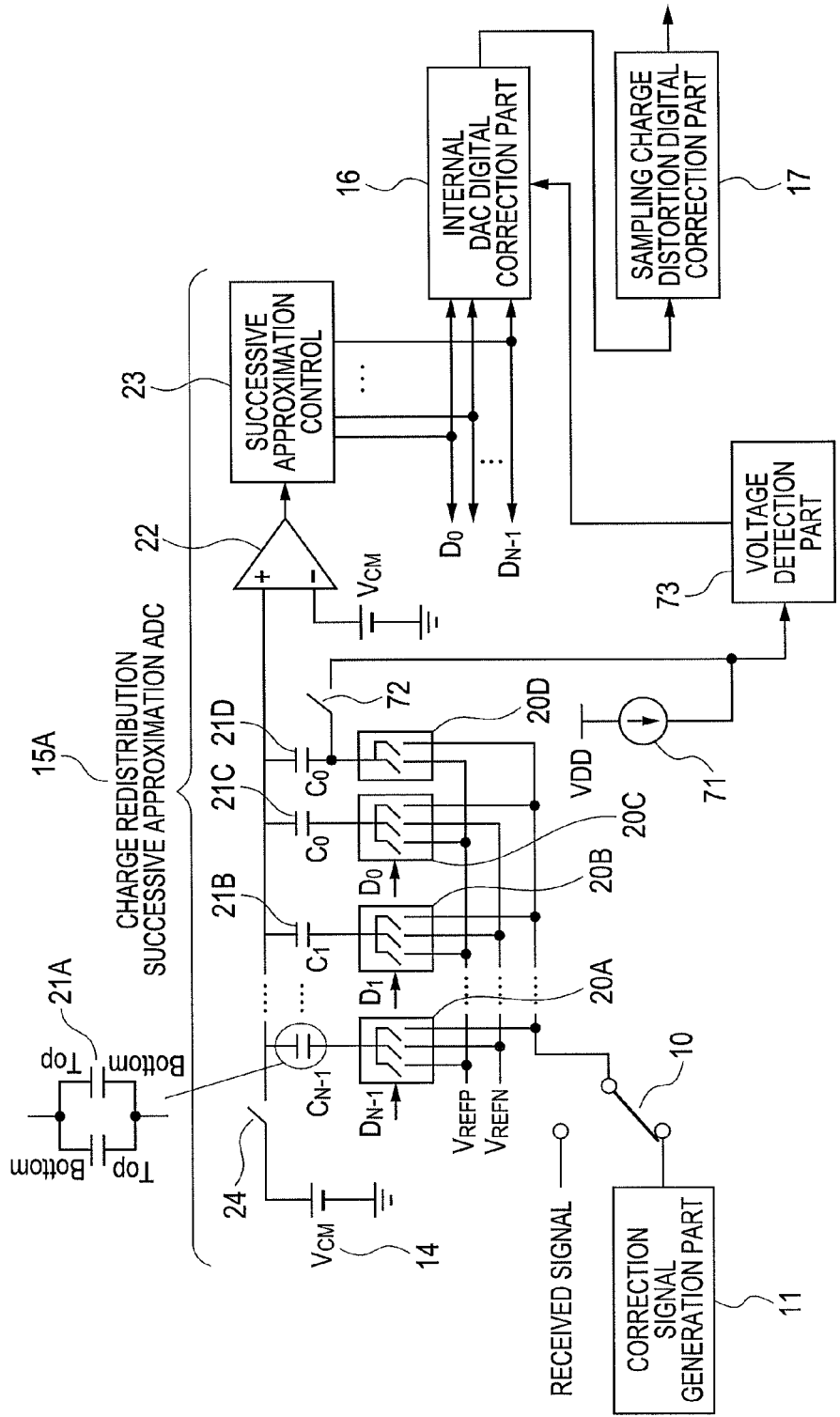
FIG. 7 is a diagram illustrating a configuration of a fifth embodiment of the present invention.

FIG. 7 illustrates a fifth embodiment of the present invention. According to this embodiment, in the second embodiment, instead of supplying the internal DAC correction signal from the correction signal generation part 11 to conduct the digital correction of the internal DAC, the capacitance values of the respective internal DAC/sampling capacitors 21A to 21D are directly measured, and the internal DAC correction factor is determined on the basis of the measured results. In this embodiment, for simplification of description, only the capacitance value of the internal DAC/sampling capacitor 21D is measured. However, all of the capacitance values may be measured.

In order to measure the capacitance value of the internal DAC/sampling capacitor 21D, in addition to the configuration of the second embodiment, the A/D converter includes a capacitance value measurement switch 72 connected to a lower electrode of the internal DAC/sampling capacitor 21D, a current source 71, and a voltage detection part 73 connected between the capacitance value measurement switch 72 and the current source 71. The output of the voltage detection part 73 is connected to the internal DAC digital correction part 16.

At the time of the digital correction of the internal DAC, for example, when the capacitance value of the internal DAC/sampling capacitor 21D is measured, the reset switch 24 and the capacitance value measurement switch 72 turn on, and a given DC current supplied from the current source 71 is charged in the internal DAC/sampling capacitor 21D for a given period. The voltage detection part 73 detects the charging voltage, calculates the internal DAC correction factor corresponding to the internal DAC/sampling capacitor 21D on the basis of the detected result, and supplies the obtained correction factor to the internal DAC digital correction part 16. The internal DAC digital correction part 16 conducts the digital correction with the use of the supplied correction factor. The voltage detection part 73 may include a low-speed high resolution ADC for detection of the charging voltage. The other operation is the same as that of the second embodiment.

Sixth Embodiment

Figure 8:
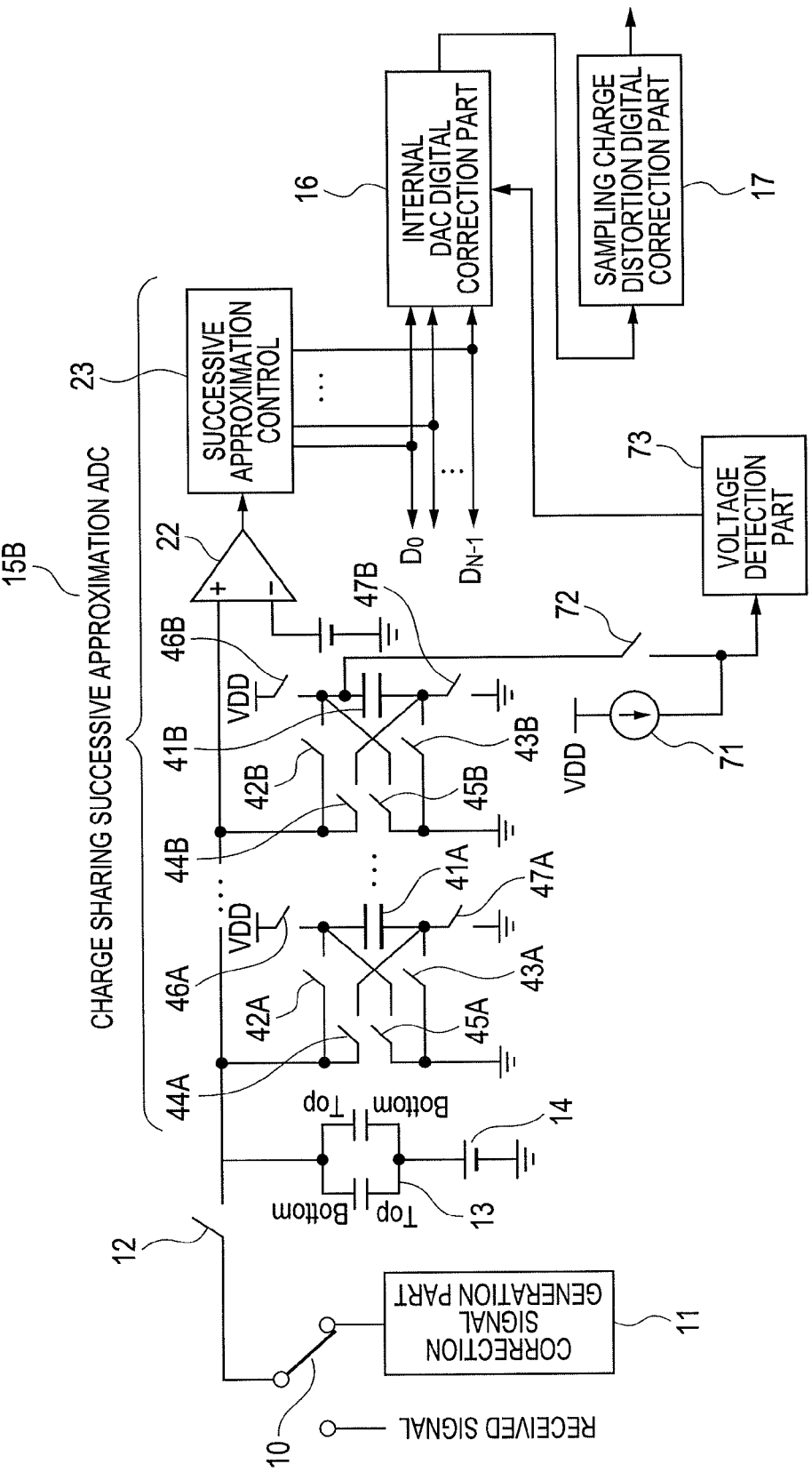
FIG. 8 is a diagram illustrating a configuration of a sixth embodiment of the present invention.

FIG. 8 illustrates a seventh embodiment of the present invention. According to this embodiment, in the first embodiment, instead of supplying the internal DAC correction signal from the correction signal generation part 11 to conduct the digital correction of the internal DAC, the capacitance values of the internal DAC capacitors 41A and 41B are directly measured, and the internal DAC correction factor is determined on the basis of the measured results. In this embodiment, for simplification of description, only the capacitance value of the internal DAC capacitor 41B is measured. However, all of the capacitance values may be measured.

In order to measure the capacitance value of the internal DAC capacitor 41B, in addition to the configuration of the first embodiment, the A/D converter includes the capacitance value measurement switch 72 connected to an upper electrode of the internal DAC capacitor 41B, the current source 71, and the voltage detection part 73 connected between the capacitance value measurement switch 72 and the current source 71. The output of the voltage detection part 73 is connected to the internal DAC digital correction part 16.

At the time of the digital correction of the internal DAC, for example, when the capacitance value of the internal DAC capacitor 41B is measured, the ground side precharge switch 47B and the capacitance value measurement switch 72 turn on, and a given DC current supplied from the current source 71 is charged in the internal DAC/capacitor 41B for a given period. The voltage detection part 73 detects the charging voltage, calculates the internal DAC correction factor corresponding to the internal DAC capacitor 41B on the basis of the detected result, and supplies the obtained correction factor to the internal DAC digital correction part 16. The internal DAC digital correction part 16 conducts the digital correction with the use of the supplied correction factor. The voltage detection part 73 may include a low-speed high resolution ADC for detection of the charging voltage. The other operation is the same as that of the first embodiment.

Seventh Embodiment

Figure 11:
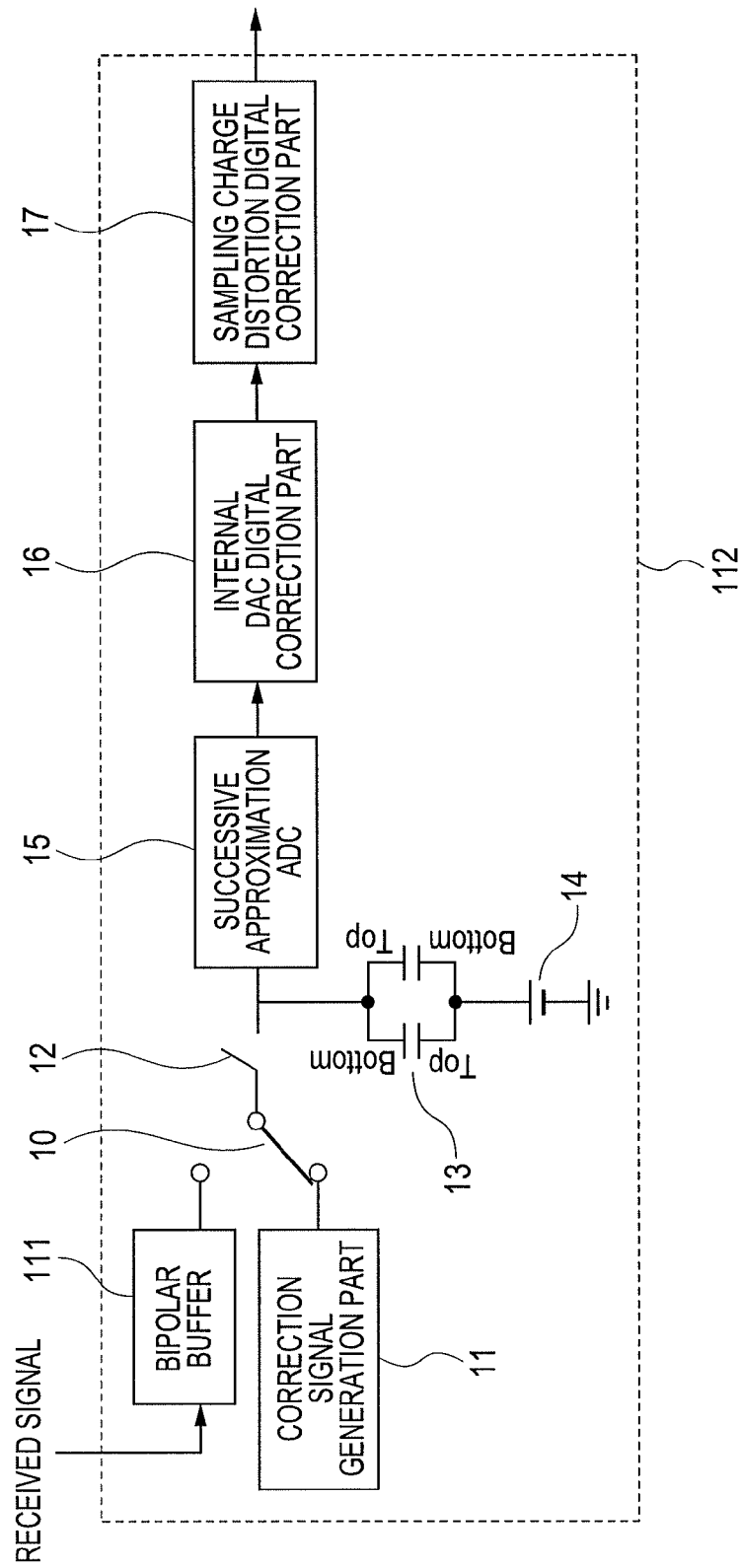
FIG. 11 is a diagram illustrating a configuration of a seventh embodiment of the present invention.

FIG. 11 illustrates a seventh embodiment of the present invention. This embodiment shows a case in which the ADC described in the first embodiment is realized as a BiCOM single chip ADC 112. In particular, a bipolar input buffer 111 is applied as an input buffer for driving the ADC. In the case of the high resolution of 18 bits or more, the capacitance value of the sampling capacitor 13 is 1 nF or more. The input buffer is required to drive a large load capacitance, and therefore a high speed response is required.

The bipolar input buffer 111 is basically configured by a bipolar transistor so that the higher speed response and lower noise than those of the buffer using a CMOS can be realized. On the other hand, the ADC is advantageously configured by the CMOS from the viewpoints that a large number of switches are used, and the internal DAC digital correction part 16 and the sampling charge distortion digital correction part 17 are configured by digital circuits. The operation is identical with that in the first to third embodiments.

Eighth Embodiment

Figure 12:
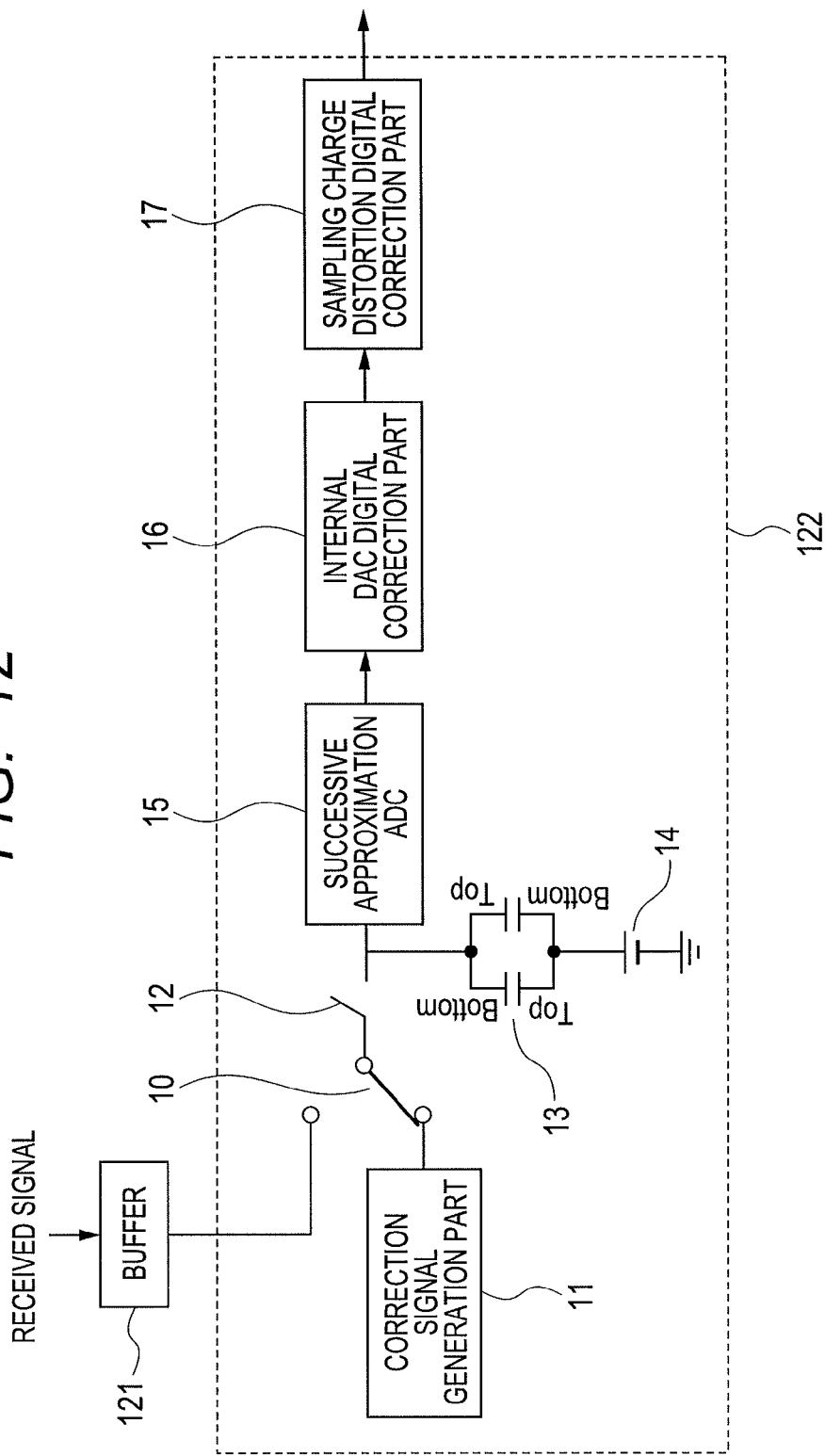
FIG. 12 is a diagram illustrating a configuration of an eighth embodiment of the present invention.

FIG. 12 illustrates an eighth embodiment of the present invention. This embodiment shows a case in which the ADC described in the first embodiment is realized as a single chip ADC 122. In particular, an input buffer for driving the ADC is not mounted within the single chip ADC 122, but disposed as an external input buffer 121. The external input buffer 121 is manufactured by a semiconductor process that makes it easier to realize the high speed response than the semiconductor process to which the single chip ADC 122 is applied, for example, by a bipolar process or a high supply voltage process, thereby enabling necessary performance to be ensured. The operation is identical with that in the first to third embodiments.

Ninth Embodiment

Figure 13:
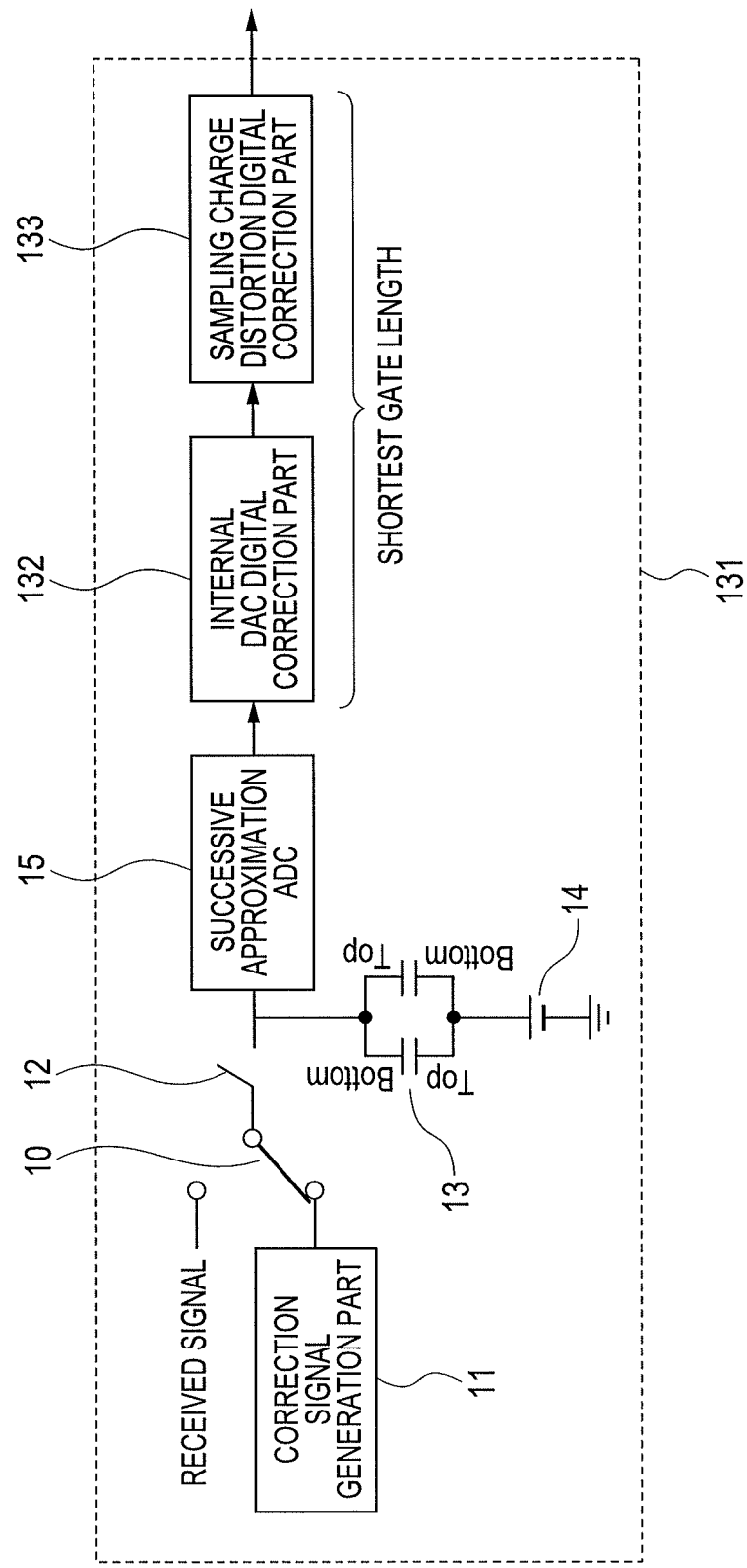
FIG. 13 is a diagram illustrating a configuration of a ninth embodiment of the present invention.

FIG. 13 illustrates a ninth embodiment of the present invention. This embodiment shows a case in which the ADC described in the first embodiment is realized as a single chip ADC 131. In particular, an internal DAC digital correction part 132 and a sampling charge distortion digital correction part 133, which are digital circuits, are realized by using MOS having the shortest gate length available for the semiconductor process to which the single chip ADC 131 is applied. As a result, the circuit area and the power consumption of the internal DAC digital correction part 132 and the sampling charge distortion digital correction part 133 can be reduced. The operation is identical with that in the first to third embodiments.

Tenth Embodiment

Figure 14:
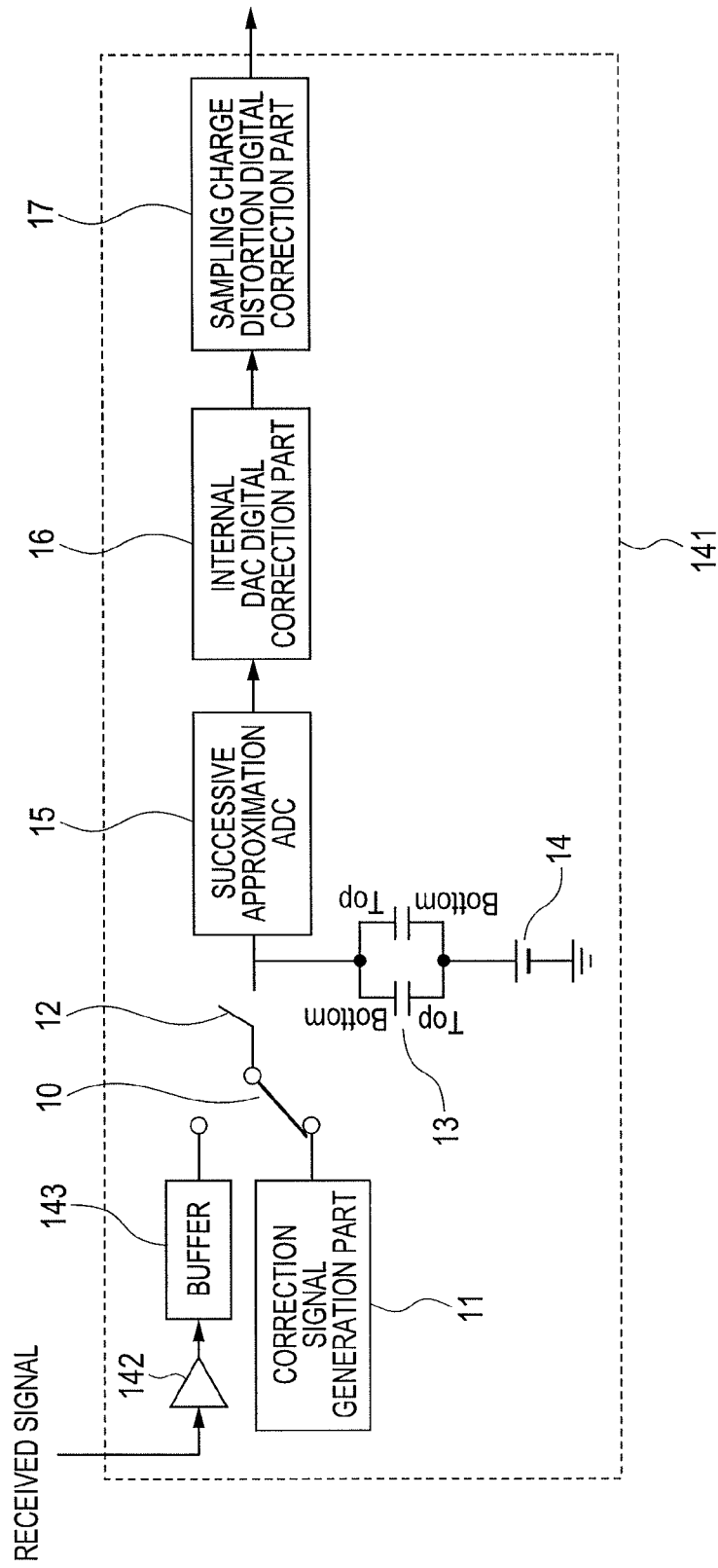
FIG. 14 is a diagram illustrating a configuration of a tenth embodiment of the present invention.

FIG. 14 illustrates a tenth embodiment of the present invention. This embodiment shows a single chip analog front end IC suited for medical devices, including the ADC described in the first embodiment. A single chip analog front end IC 141 includes an input buffer 143 and a low-noise amplifier 142 other than the ADC. The single chip analog front end IC 141 may include a filter as needed. The received signal received from a sensor is amplified by the low-noise amplifier 142. Because the received signal is weak, a thermal noise and a low-frequency (1/f) noise are designed to be sufficiently small. An output of the low-noise amplifier 142 is input to the input buffer 143, and an output of the input buffer 143 is input to the ADC. The operation is identical with that in the first to third embodiments.

In particular, the BiCMOS is applied to the single chip analog front end IC 141, and the low-noise amplifier 142 and the input buffer 143 are basically configured by bipolar transistors so that the ADC is realized by the CMOS. With the above configuration, it is conceivable that the high performance can be realized as a whole.

The digital correction of the internal DAC and the digital correction of the sampling charge distortion may be conducted by using a training period of the device.

Eleventh Embodiment

Figure 18:
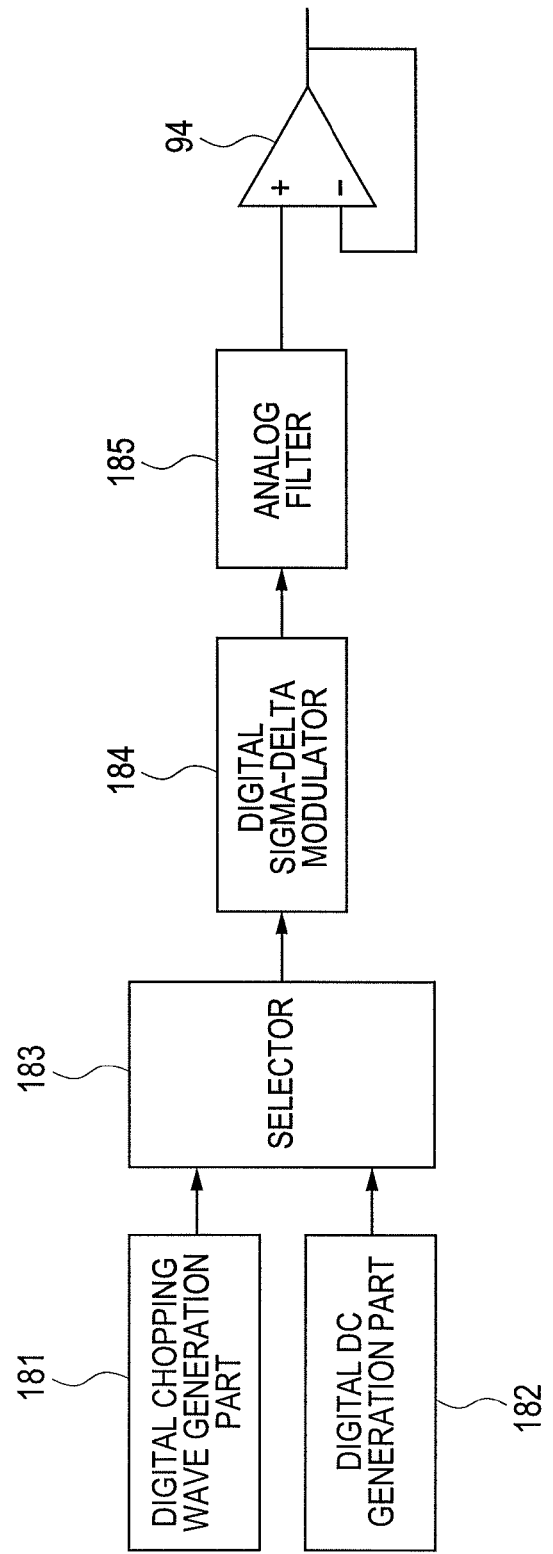
FIG. 18 is a diagram illustrating a configuration of an eleventh embodiment of the present invention.

FIG. 18 illustrates an eleventh embodiment of the present invention. This embodiment describes another method of realizing the correction signal generation part 11. A digital chopping wave generation part 181 generates a chopping wave that is an internal DAC correction signal in a digital region. A digital DC generation part 182 generates a DC signal that is a sampling charge distortion correction signal in the digital region. The digital chopping wave generation part 181 and the digital DC generation part 182 may use a ROM (read only memory for signal generation. Both outputs of the digital chopping wave generation part 181 and the digital DC generation part 182 are connected to a selector 183. The selector 183 selectively outputs an output of the digital chopping wave generation part 181 in an internal DAC correction period, and an output of the digital DC generation part 182 in a sampling charge distortion correction period. An output of the selector 183 is input to a digital sigma-delta modulator 184, and the quantized digital output of the digital sigma-delta modulator 184 is input to an analog filter 185. The analog filter 185 suppresses a quantized noise diffused toward a high frequency side within the digital sigma-delta modulator 184, thereby enabling an analog output with high precision to be obtained as an output of the analog filter 185. The output of the analog filter 185 may be further connected with a buffer 94 configured by an operational amplifier. In particular, when a quantizer within the digital sigma-delta modulator 184 is set with one bit, an output of the digital sigma-delta modulator 184 becomes binary such as high or low. With this configuration, an influence of the element variation can be avoided.

Twelfth Embodiment

Figure 19:
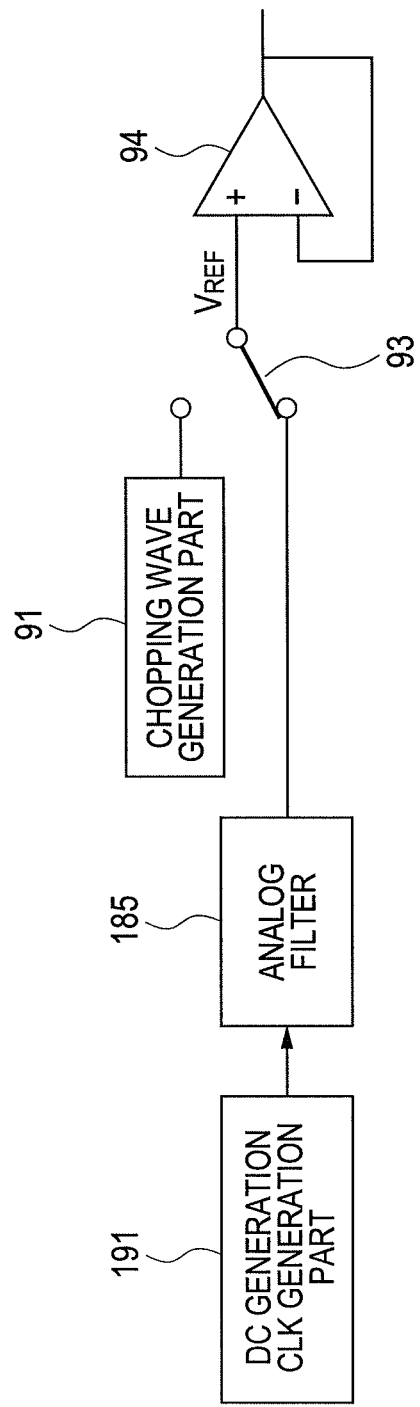
FIG. 19 is a diagram illustrating a configuration of a twelfth embodiment of the present invention.

FIG. 19 illustrates a twelfth embodiment of the present invention. This embodiment describes still another method of realizing the correction signal generation part 11. The chopping wave generation part 91 generates a chopping wave that is an internal DAC correction signal. A DC generation CLK generation part 191 generates a clock signal having a given duty ratio (a ratio of a high period to a low period) for generating a DC signal that is a sampling charge distortion correction signal. An output of the DC generation CLK generation part 191 is connected to the analog filter 185, and a high frequency component of the output is suppressed so that the DC voltage corresponding to the duty ratio of the clock signal can be obtained from the output of the analog filter 185. Both the output of the chopping wave generation part 91 and the output of the analog filter 185 are connected to the correction signal changeover switch 93. The correction signal changeover switch 93 selectively outputs an output of the chopping wave generation part 91 in the internal DAC correction period, and an output of the analog filter 185 in the sampling charge distortion correction period. The output of the correction signal changeover switch 93 may be further connected with a buffer 94 configured by an operational amplifier. In this embodiment, the precision of the DC voltage obtained as the sampling charge distortion correction signal is determined according to only the duty ratio of the clock signal generated in the DC generation CLK generation part 191. As a result, an influence of the element variation can be avoided.

What is claimed is:

1. An A/D converter, comprising:
an input signal changeover switch that selects a received signal or a correction signal from an external;
a sampling capacitor part that includes first and second capacitors each having a terminal connected in inverse parallel to each other, and having a capacitance value equal to each other, is electrically connected to the input signal changeover switch, and accumulates sampling charge sampling the received signal or the correction signal therein;
a successive approximation A/D conversion part that includes a plurality of internal DAC capacitors, is electrically connected to the input signal changeover switch, and conducts A/D conversion on the sampling charge;
a first digital correction part that is electrically connected to the successive approximation A/D conversion part, and digitally corrects respective capacitance variations of the plurality of internal DAC capacitors; and
a second digital correction part that is electrically connected to the first digital correction part, and digitally corrects a third-order or more factor of a voltage dependence of the sampling charge.

2. The A/D converter according to claim 1, further comprising: a correction signal generation part that is electrically connected to the input signal changeover switch, and generates the correction signal,
wherein the correction signal generation part generates first and second DC voltages different in voltage value as the correction signal, and
wherein the second digital correction part digitally corrects the third-order or more factor of the voltage dependence of the sampling charge by using an output of the first digital correction part corresponding to the first DC voltage, and an output of the first digital correction part corresponding to the second DC voltage.

3. The A/D converter according to claim 2,
wherein the correction signal generation part generates a plurality of the first DC voltages and a plurality of the second DC voltages,
wherein the second digital correction part digitally corrects the third-order or more factor of the voltage dependence of the sampling charge by using a plurality of the outputs of the first digital correction part corresponding to the plurality of first DC voltages, and a plurality of the outputs of the first digital correction part corresponding to the plurality of second DC voltages.

4. The A/D converter according to claim 3,
wherein the correction signal generation part includes a reference DC voltage source, and a plurality of voltage dividers that are connected to the reference DC voltage source, and each includes an identical resistor, and uses a different one of the plurality of voltage dividers when generating the plurality of first DC voltages and the plurality of second DC voltages.

5. The A/D converter according to claim 1,
wherein the second digital correction part corrects the third-order factor of the voltage dependence of the sampling charge, and an odd-order factor which is higher than the third order.

6. The A/D converter according to claim 1, further comprising: a voltage detection part and a current source, for measuring any capacitance value of the plurality of internal DAC capacitors.

7. An A/D converter, comprising:
- an input signal changeover switch that selects a received signal or a correction signal from an external;
- a successive approximation A/D conversion part that includes a plurality of capacitor parts that accumulate sampling charge sampling the received signal or the correction signal therein, is electrically connected to the input signal changeover switch, and conducts A/D conversion on the sampling charge;
- a first digital correction part that is electrically connected to the successive approximation A/D conversion part, and digitally corrects respective capacitance variations of the plurality of capacitor parts; and
- a second digital correction part that is electrically connected to the first digital correction part, and digitally corrects a third-order or more factor of a voltage dependence of the sampling charge,
- wherein each of the plurality of capacitor parts includes first and second capacitors each having a terminal connected in inverse parallel to each other, and having a capacitance value equal to each other.

8. The A/D converter according to claim 7, further comprising: a correction signal generation part that is electrically connected to the input signal changeover switch, and generates the correction signal,
- wherein the correction signal generation part generates first and second DC voltages different in voltage value as the correction signal, and
- wherein the second digital correction part digitally corrects the third-order or more factor of the voltage dependence of the sampling charge by using an output of the first digital correction part corresponding to the first DC voltage, and an output of the first digital correction part corresponding to the second DC voltage.

9. The A/D converter according to claim 8,
- wherein the correction signal generation part generates a plurality of the first DC voltages and a plurality of the second DC voltages,
- wherein the second digital correction part digitally corrects the third-order or more factor of the voltage dependence of the sampling charge by using a plurality of the outputs of the first digital correction part corresponding to the plurality of first DC voltages, and a plurality of the outputs of the first digital correction part corresponding to the plurality of second DC voltages.

10. The A/D converter according to claim 9,
- wherein the correction signal generation part includes a reference DC voltage source, and a plurality of voltage dividers that are connected to the reference DC voltage source, and each includes an identical resistor, and uses a different one of the plurality of voltage dividers when generating the plurality of first DC voltages and the plurality of second DC voltages.

11. The A/D converter according to claim 7,
- wherein the second digital correction part corrects the third-order factor of the voltage dependence of the sampling charge, and an odd-order factor which is higher than the third order.

12. The A/D converter according to claim 7,
- wherein the successive approximation A/D conversion part further includes first and second power supplies each connected to any one of the plurality of capacitor parts when conducting the A/D conversion on the sampling charge, a third power supply having an average potential of the first and second power supplies, and a DC shift capacitor part having a third capacitor,
- wherein the correction signal includes a signal used for a plurality of A/D conversions in the successive approximation A/D conversion part, and
- wherein the DC shift capacitor part is connected to any different one of the first, second, and third power supplies between when a signal used for a first A/D conversion among the plurality of A/D conversions is supplied to the successive approximation A/D conversion part, and when a signal used for a second A/D conversion among the plurality of A/D conversions is supplied to the successive approximation A/D conversion part.

13. The A/D converter according to claim 7, further comprising: a voltage detection part and a current source, for measuring any capacitance value of the plurality of capacitor parts.

* * * * *